United States Patent
Suzuki et al.

(10) Patent No.: US 8,960,208 B2
(45) Date of Patent: Feb. 24, 2015

(54) ULTRASONIC CLEANING DEVICE

(71) Applicant: Kaijo Corporation, Tokyo (JP)

(72) Inventors: Kazunari Suzuki, Hamura (JP); Ki Han, Hamura (JP)

(73) Assignee: Kaijo Corporation, Tokyo (JP)

( * ) Notice: Subject to any disclaimer, the term of this patent is extended or adjusted under 35 U.S.C. 154(b) by 71 days.

(21) Appl. No.: 13/856,597

(22) Filed: Apr. 4, 2013

(65) Prior Publication Data

US 2013/0220390 A1     Aug. 29, 2013

Related U.S. Application Data

(62) Division of application No. 12/451,568, filed as application No. PCT/JP2009/064813 on Aug. 19, 2009, now Pat. No. 8,448,655.

(30) Foreign Application Priority Data

Aug. 20, 2008    (JP) ................................ 2008-211977

(51) Int. Cl.
     *B08B 3/12*        (2006.01)
     *H01L 21/67*     (2006.01)

(52) U.S. Cl.
     CPC .... *H01L 21/67017* (2013.01); *H01L 21/67051* (2013.01); *H01L 21/67057* (2013.01); *B08B 3/12* (2013.01); *Y10S 134/902* (2013.01)
     USPC ................. 134/198; 134/184; 134/1.3; 134/1; 134/34; 134/902

(58) Field of Classification Search
     CPC .................... H01L 21/67051; H01L 21/67057; B08B 3/12; B08B 2203/0288; B08B 3/02
     USPC .......... 134/184, 1.3, 1, 34, 902, 33, 147, 153, 134/198, 131, 137, 157
     See application file for complete search history.

(56) References Cited

U.S. PATENT DOCUMENTS

| | | | |
|---|---|---|---|
| 4,326,553 A | * | 4/1982 | Hall ............................... 134/153 |
| 6,039,814 A | * | 3/2000 | Ohmi et al. ........................ 134/1 |
| 2005/0161059 A1 | | 7/2005 | Franklin et al. |

FOREIGN PATENT DOCUMENTS

| | | |
|---|---|---|
| JP | 3493492 | 2/2004 |
| JP | 2007-502032 | 2/2007 |

(Continued)

OTHER PUBLICATIONS

Suzuki et al., "Ultrasonic Cleaning Device", Nov. 2007, JP 2007-289807 Machine Translation.*

*Primary Examiner* — Michael Barr
*Assistant Examiner* — Thomas Bucci
(74) *Attorney, Agent, or Firm* — Wenderoth, Lind & Ponack, LLP

(57) ABSTRACT

An ultrasonic cleaning device includes an ultrasonic transducer (13) for providing ultrasonic energy to a propagation liquid (15), an ultrasonic propagation tube (12) for flowing the propagation liquid provided with the ultrasonic energy by the ultrasonic transducer, a holding mechanism disposed below the ultrasonic propagation tube for holding an object to be cleaned (21), and a cleaning liquid supply mechanism for supplying a cleaning liquid to a cleaning surface of the object to be cleaned held by the holding mechanism. The ultrasonic propagation tube (12) is disposed so that a side surface thereof may contact a liquid film (19) of the cleaning liquid formed on the cleaning surface by supplying the cleaning liquid to the cleaning surface by the cleaning liquid supply mechanism.

2 Claims, 21 Drawing Sheets

(56) References Cited

FOREIGN PATENT DOCUMENTS

| | | |
|---|---|---|
| JP | 2007-289807 | 11/2007 |
| JP | 2007289807 A * | 11/2007 |
| WO | 2005/006396 | 1/2005 |

* cited by examiner

FIG.14
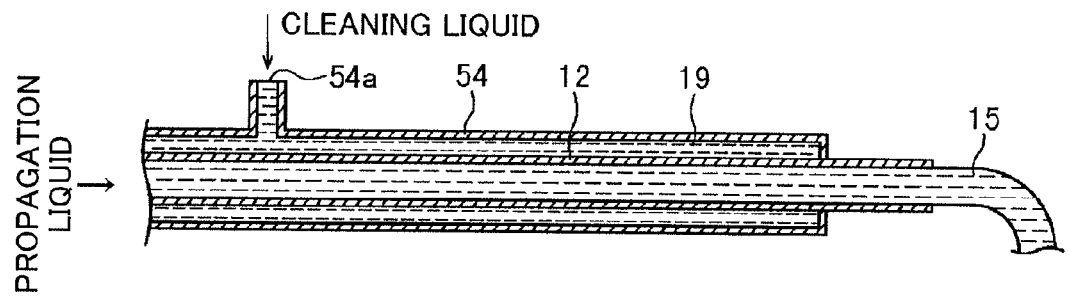
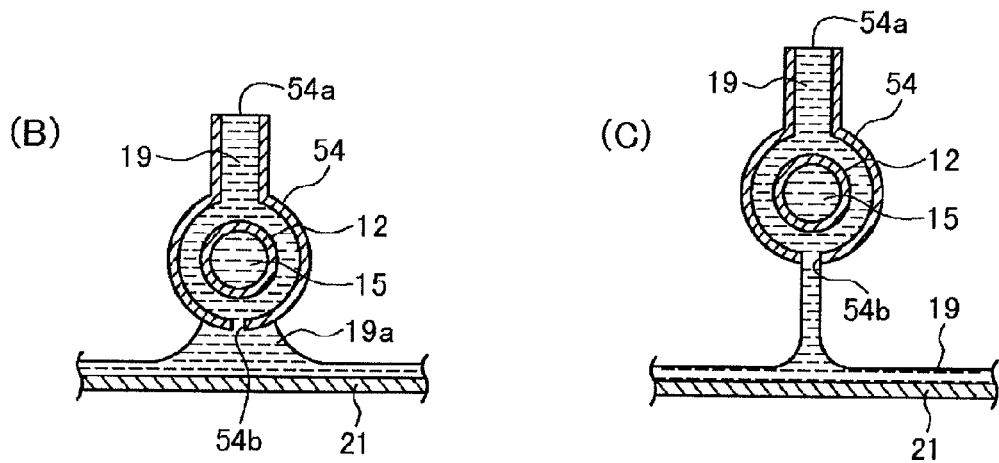
FIG.15
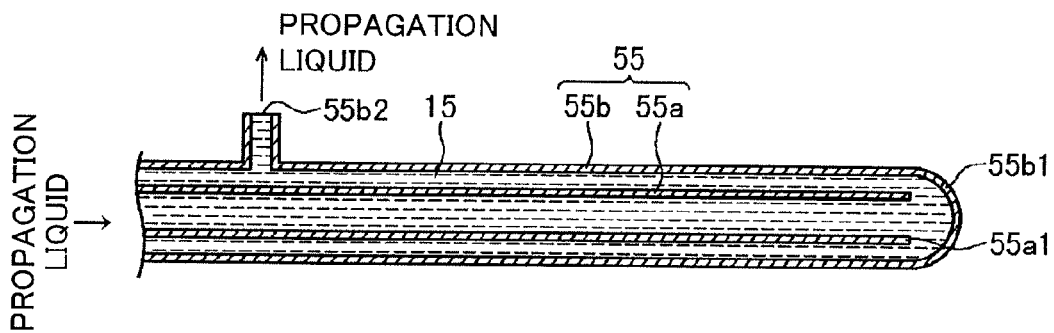

MEASURING METHOD

ENTIRETY

TUBE PORTION

OSCILLATION DISTRIBUTION OF TUBE OF THIS INVENTION

OSCILLATION DISTRIBUTION OF PROBE (SOLID ROD)

OSCILLATION SOURCE
(FREQUENCY : 950kHz)

TUBE OUTER DIAMETER : $\phi 6$
INNER DIAMETER : $\phi 4$
LENGTH : 300mm
MATERIAL : QUARTZ
MEDIUM : WATER OSCILLATION SOURCE
(FREQUENCY : 950kHz)

ROD OUTER DIAMETER : $\phi 6$
LENGTH : 300mm
MATERIAL : QUARTZ

ULTRASONIC CLEANING DEVICE

This application is a divisional application of application Ser. No. 12/451,568, now U.S. Pat. No. 8,448,655, which is the National Stage of International Application No. PCT/JP2009/064813, filed Aug. 19, 2009.

CROSS-REFERENCE TO RELATED APPLICATIONS

The present application claims priority from Japanese Patent Application No. 2008-211977, filed Aug. 20, 2008, the contents of which are herein incorporated by reference in their entirety.

BACKGROUND OF THE INVENTION

1. Technical Field

The present invention relates to an ultrasonic cleaning device by single-wafer spin cleaning, an immersion type ultrasonic cleaning device, and an ultrasonic cleaning device for cleaning a large substrate.

2. Description of the Related Art

<Single-Wafer Spin Cleaning>

FIG. 24 is a sectional view illustrating a prior art spot-shower type ultrasonic cleaning device for single-wafer spin cleaning. This ultrasonic cleaning device is the one for cleaning an object to be cleaned 101 having a flat plane such as a semiconductor wafer. This device has a mechanism (not shown) for spinning the object to be cleaned 101 in order to clean the entire surface of the object to be cleaned 101, an ultrasonic transducer 103 for providing ultrasonic energy to a cleaning liquid, a cleaning-liquid supply port 105 for supplying the cleaning liquid to the ultrasonic transducer 103, a nozzle 104 for injecting a cleaning liquid 102 provided with the ultrasonic energy to the object to be cleaned 101 in a spotted manner, and a swing mechanism (not shown) for swinging the nozzle 104 (See Patent Document 1, for example).

As mentioned above, with the ultrasonic cleaning device shown in FIG. 24, since an ultrasonic irradiation region is a point (spot), there has been required a swing mechanism for swinging the nozzle 104 in order to clean the entire surface on the object to be cleaned 101. Also, the larger a substrate to be cleaned is, the more time it takes for swinging it, and there is a problem that cleaning time of the device cannot be reduced.

Also, in order to reduce a distance between the nozzle 104 and the object to be cleaned 101, the nozzle 104 needs to be installed in the vicinity on the object to be cleaned 101, which makes workability poor. Also, since an installation space for the nozzle 104 is limited, it is difficult to install a plurality of nozzles.

For the cleaning liquid, in addition to deionized water and functional water in which gas (nitrogen, hydrogen, helium, ozone and the like) to improve a cleaning effect or gas (carbon dioxide) having an antistatic action are added to the deionized water, ammonia hydrogen peroxide solution with the purpose of removing particles, dilute hydrofluoric acid with an etching action, a stripper liquid for removing a resist film and the like are used. Since these cleaning liquids pass through the inside of the ultrasonic transducer 103, a member resistant against the cleaning liquid should be selected for the housing 106, an oscillation plate, the nozzle 104, and a packing, which are portions to contact the liquid. Also, in order to prevent contamination from the member, cleanliness of each member should be maintained.

FIG. 25 is a sectional view illustrating a prior-art probe (solid rod) type ultrasonic cleaning device for single-wafer spin cleaning. This ultrasonic cleaning device is a device for cleaning the object to be cleaned 101 having a flat plane such as a semiconductor wafer. This device has a mechanism (not shown) for spinning the object to be cleaned 101 in order to clean the entire surface of the object to be cleaned 101, a cleaning liquid supply nozzle 107 for supplying a cleaning liquid 102 to the surface of the object to be cleaned 101, a probe (solid rod) 108 to contact the cleaning liquid 102 supplied to the surface of the object to be cleaned 101, the ultrasonic transducer 103 for providing ultrasonic energy to the probe (solid rod) 108 through a heat transfer member 109, and a coolant supply port 110 and a coolant discharge port 111 for supplying and discharging a coolant for cooling the heat transfer member 109 (See Patent Document 2, for example).

In the above-mentioned ultrasonic cleaning device shown in FIG. 25, since the ultrasonic irradiation region is on a line along the probe (solid rod) 108, time required for cleaning the entire surface on the object to be cleaned 101 can be largely reduced as compared with the spot shower type cleaning device. Also, since a swing mechanism for swinging the probe (solid rod) 108 is not needed, a space required for installation of the probe (solid rod) 108 can be reduced.

Also, since a liquid contact portion is only the probe (solid rod) 108, it is only necessary to select a member resistant against the cleaning liquid 102 only for the probe (solid rod) 108. The probe (solid rod) 108 is made of an inactive non-contaminant such as quartz, and contamination from the liquid contact portion can be easily prevented.

Also, in order to oscillate the probe (solid rod) 108 formed from a solid material with a high density such as quartz, an acoustically large load is applied to an oscillating element and causes a large amount of heat. Thus, with such a probe (solid rod)-type ultrasonic cleaning device, energy is propagated to the probe (solid rod) 108 through the thermally conductive member 109 for cooling the ultrasonic transducer 103 and the probe (solid rod) 108. Then, in order to efficiently cool the heat transfer member 109, a coolant passing through the heat transfer member 109 needs to be circulated.

Also, if the probe (solid rod) 108 is oscillated by the drive of the ultrasonic transducer 103, standing wave distribution is generated in the probe (solid rod) 108 as shown in FIG. 26. A wavelength $\lambda$ of the standing wave distribution can be calculated as $\lambda = V/F$ from a sonic speed V and an operating frequency F in the probe (solid rod) 108. If the probe (solid rod) material is quartz, the sonic speed V=6000 m/s, and in the case of the operating frequency F=1 MHz, the wavelength $\lambda$=6 mm.

Since the sonic speed V and the operating frequency F in the probe (solid rod) 108 have a temperature characteristic, it is necessary to make temperatures of the probe (solid rod) 108 and the ultrasonic transducer 103 constant in order to maintain the standing wave distribution in the probe (solid rod) 108. Therefore, cooling temperature control by a coolant needs to be executed.

Also, in order to form the standing wave distribution, it is necessary to design the probe length with integral multiple of $\lambda/2$. Since the standing wave distribution is not formed if the probe (solid rod) length is varied even slightly, predetermined oscillation amplitude is not obtained if the ultrasonic transducer 103 is driven. Therefore, it is necessary to manufacture the probe (solid rod) 108 with an accurate probe length.

Also, the cleaning effect can be obtained at a position of antinodes of displacement amplitude shown in FIG. 26, but the cleaning effect lowers at a position of nodes. An interval between nodes is λ/2=3 mm, and the cleaning effect lowers with the interval of 3 mm.

Also, in the ultrasonic cleaning device shown in FIG. 25, the length of the probe (solid rod) 108 needs to be lengthened approximately to a radius of the object to be cleaned 101. Thus, in order to cope with an increase in diameter of the object to be cleaned 101, the length of the probe (solid rod) 108 needs to be lengthened accordingly. For example, for a 200-mm wafer, the length of the probe (solid rod) 108 needs to be approximately 100 mm, and for a 300-mm wafer, the length of the probe (solid rod) 108 needs to be approximately 150 mm. However, the probe length that can be driven is limited, and if the probe (solid rod) reaches certain length, it can no longer be driven due to an acoustic load applied to the ultrasonic transducer. Therefore, it is difficult to cope with an increase in diameter larger than the 300-mm wafer with the ultrasonic cleaning device in FIG. 25.

Patent Document 1: Japanese Patent Laid-Open No. 2007-289807 (FIG. 1)
Patent Document 2: Japanese Patent No. 3493492 (FIG. 1)

<Immersion Type Cleaning>

FIG. 27(A) is a sectional view of a prior-art immersion type ultrasonic cleaning device, and FIG. 27(B) is a sectional view obtained by cutting the ultrasonic cleaning device in a direction perpendicular to the section shown in FIG. 27(A).

This ultrasonic cleaning device has a general cleaning tank used in the immersion type cleaning of a semiconductor wafer and this cleaning tank has an indirect cleaning structure in which an inner tank 112 filled with a cleaning liquid is placed on an outer tank (not shown) in which an ultrasonic transducer 113 is installed on a bottom face. The cleaning liquid is introduced into a jet pipe 114 from a cleaning liquid inlet 114a, and the introduced cleaning liquid is discharged from a side surface of the jet pipe 114 into the inner tank 112 as shown by an arrow and is overflowed from the upper part of the inner tank 112.

A wafer as an object to be cleaned 115 installed in the inner tank 112 is supported by a carrier (transporting unit) 116 for transporting wafer. Ultrasonic energy is irradiated from the bottom face, but the ultrasonic energy hits a receiver portion 116a in bottom part of the carrier 116, and there is a problem that a shaded portion in which ultrasonic energy does not reach the wafer is caused or air bubbles which adversely affect cleaning efficiency are generated.

Also, since the ultrasonic transducer 113 is installed on the bottom face of the cleaning tank, there is a need to provide a cleaning liquid drain port 112a on the side surface of the inner tank 112. If the cleaning liquid drain port 112a is provided on the side surface, there is a problem that drainage of the cleaning liquid takes time or the cleaning liquid cannot fully be drained from the inner tank 112.

<Large Substrate Cleaning>

A substrate size of FPD or a solar cell is getting larger, and a substrate size can reach even 2.8 m×3.5 m. In the case of a substrate with a size up to 1 m×1 m, the substrate is disposed horizontally, and the cleaning liquid provided together with ultrasonic energy is ejected like line shape shower onto this substrate by so called Ultrasonic Line Shower Cleaning Unit. In this way, the substrate is cleaned by the cleaning liquid.

However, as the substrate size gets larger, considering the above cleaning method for a 1.5 m×1.5 m substrate, for example, the cleaning liquid to be supplied to the substrate needs a large flow rate exceeding 100 L/min, the weight of the transducer reaches 18 kg, and as a result, manufacture and installation of the cleaning device becomes extremely difficult. Therefore, there is a problem that the cleaning device with the above cleaning method cannot process the substrate size exceeding 1 m×1 m.

Also, if the substrate with a size of 1.5 m×1.5 m or more is placed horizontally, the substrate is deflected by the weight of the discharged cleaning liquid, and it is foreseen that the liquid cannot be completely drained or dried.

SUMMARY OF THE INVENTION

As described above, with the prior-art probe (solid rod)-type ultrasonic cleaning device for single-wafer spin cleaning and the prior-art ultrasonic cleaning device for cleaning large substrates, it is difficult to cope with an increase in diameter of a cleaning surface of an object to be cleaned. Thus, the ultrasonic cleaning device is demanded which can easily cope with an increase in diameter of the cleaning surface of the object to be cleaned.

Also, with the prior-art immersion type ultrasonic cleaning device, the object to be cleaned 115 supported by the carrier 116 is immersed in a cleaning tank 56, and the ultrasonic energy is irradiated from the bottom face of the cleaning tank. Thus, there is a problem that the ultrasonic energy hits the receiving portion 116a in bottom part of the carrier 116 and does not reach the object to be cleaned. Thus, a new ultrasonic cleaning device with which such a problem is not caused is cleaned.

The present invention was made in view of the above circumstances and has an purpose to solve any of the above-mentioned problems.

In order to solve the above problems, an ultrasonic cleaning device according to the present invention comprises:

an ultrasonic transducer for providing ultrasonic energy to a propagation liquid;

an ultrasonic propagation tube for flowing the propagation liquid provided with the ultrasonic energy by the ultrasonic transducer;

a holding mechanism disposed below the ultrasonic propagation tube for holding an object to be cleaned; and a cleaning liquid supply mechanism for supplying a cleaning liquid to a cleaning surface of the object to be cleaned held by the holding mechanism, and the ultrasonic propagation tube is disposed so that a side surface thereof may contact a liquid film of the cleaning liquid formed on the cleaning surface by supplying the cleaning liquid to the cleaning surface by the cleaning liquid supply mechanism.

According to the above ultrasonic cleaning device, it is possible to provide the ultrasonic energy to the cleaning liquid supplied to the cleaning surface of the object to be cleaned through the side surface of the ultrasonic propagation tube by flowing the propagation liquid provided with the ultrasonic energy by the ultrasonic transducer through the ultrasonic propagation tube. As a result, the cleaning surface of the object to be cleaned can be cleaned by the cleaning liquid and the ultrasonic energy.

Also, the ultrasonic cleaning device according to the present invention can further comprise: a housing for housing one end of the ultrasonic propagation tube and the ultrasonic transducer placed so as to oppose the one end; a propagation liquid supply device for supplying a propagation liquid into the housing; a dissolved gas concentration adjuster for adjusting a dissolved gas concentration of the propagation liquid; a propagation liquid recovery tank for recovering the propagation liquid discharged from the other end of the ultrasonic propagation tube; and a circulation pump for supplying the propagation liquid in the propagation liquid recovery tank into the housing again.

An ultrasonic cleaning device according to the present invention comprises:

an ultrasonic transducer for providing ultrasonic energy to a cleaning liquid;

an ultrasonic propagation tube for flowing the cleaning liquid provided with the ultrasonic energy by the ultrasonic transducer;

a holding mechanism disposed below the ultrasonic propagation tube for holding an object to be cleaned; and a slit or a plurality of holes provided on a side wall of the ultrasonic propagation tube for discharging the cleaning liquid to a cleaning surface of the object to be cleaned held by the holding mechanism.

The above ultrasonic cleaning device flows the cleaning liquid provided with the ultrasonic energy by the ultrasonic transducer through the ultrasonic propagation tube, and discharges the cleaning liquid from the slit or the plurality of holes provided on the side wall of the ultrasonic propagation tube to the cleaning surface of the object to be cleaned. As a result, the cleaning surface of the object to be cleaned can be cleaned by the cleaning liquid and the ultrasonic energy.

Also, in the ultrasonic cleaning device according to the present invention, the ultrasonic propagation tube can be disposed so that the side surface thereof may contact a liquid film of the cleaning liquid formed on the cleaning surface by discharging the cleaning liquid to the cleaning surface from the slit or the plurality of holes.

The ultrasonic cleaning device according to the present invention comprises:

an ultrasonic transducer for providing ultrasonic energy to a propagation liquid;

an ultrasonic propagation tube for flowing the propagation liquid provided with the ultrasonic energy by the ultrasonic transducer;

a cleaning liquid supply pipe disposed outside the ultrasonic propagation tube so as to cover the ultrasonic propagation tube;

a holding mechanism disposed below the cleaning liquid supply pipe for holding an object to be cleaned;

an introduction port provided in the cleaning liquid supply pipe for introducing a cleaning liquid; and a slit or a plurality of holes provided on a side wall of the cleaning liquid supply pipe for discharging the cleaning liquid introduced from the introduction port to a cleaning surface of the object to be cleaned held by the holding mechanism.

According to the above ultrasonic cleaning device, it is possible to provide the ultrasonic energy to the cleaning liquid introduced to the cleaning liquid supply pipe through the side surface of the ultrasonic propagation tube by flowing the propagation liquid provided with the ultrasonic energy by the ultrasonic transducer through the ultrasonic propagation tube. Then, the cleaning liquid provided with the ultrasonic energy is discharged from the slit or the plurality of holes to the cleaning surface of the object to be cleaned. As a result, the cleaning surface of the object to be cleaned can be cleaned by the cleaning liquid and the ultrasonic energy.

Also, in the ultrasonic cleaning device according to the present invention, the cleaning liquid supply pipe can be disposed so that a side surface thereof may contact a liquid film of the cleaning liquid formed on the cleaning surface by discharging the cleaning liquid from the slit or the plurality of holes to the cleaning surface.

Also, in the ultrasonic cleaning device according to the present invention, the ultrasonic transducer is preferably disposed so as to oppose one end of the ultrasonic propagation tube, and a single or a plurality of flange portions is preferably provided at the one end of the ultrasonic propagation tube.

Also, in the ultrasonic cleaning device according to the present invention, the ultrasonic transducer is preferably disposed so as to oppose one end of the ultrasonic propagation tube, and the one end of the ultrasonic propagation tube preferably has a tapered shape in which an inner diameter of the tube is getting large as getting close to the ultrasonic transducer.

Also, in the ultrasonic cleaning device according to the present invention, an attenuator for absorbing the ultrasonic energy can be provided at the other end of the ultrasonic propagation tube.

An ultrasonic cleaning device according to the present invention comprises:

an ultrasonic transducer for providing ultrasonic energy to a propagation liquid;

an ultrasonic propagation tube in a double tube structure with an inner tube and an outer tube for flowing the propagation liquid provided with the ultrasonic energy by the ultrasonic transducer, wherein the propagation liquid is introduced from one end of the inner tube and discharged from the other end of the inner tube, and the discharged propagation liquid passes through the inner surface of the outer tube and is discharged from a side surface of the outer tube;

a holding mechanism disposed below the ultrasonic propagation tube for holding an object to be cleaned; and a cleaning liquid supply mechanism for supplying a cleaning liquid to a cleaning surface of the object to be cleaned held by the holding mechanism, and the ultrasonic propagation tube is disposed so that the outer surface of the outer tube may contact a liquid film of the cleaning liquid formed on the cleaning surface by supplying the cleaning liquid to the cleaning surface by the cleaning liquid supply mechanism.

Also, in the ultrasonic cleaning device according to the present invention, the propagation liquid is deionized water and a dissolved gas concentration in the deionized water is preferably adjusted to 2 to 4.5 ppm.

An ultrasonic cleaning device for cleaning an object to be cleaned by immersing the object in a cleaning liquid within a cleaning tank according to the present invention comprises, an ultrasonic transducer for providing ultrasonic energy to the cleaning liquid;

an ultrasonic propagation tube for flowing the cleaning liquid provided with the ultrasonic energy by the ultrasonic transducer; and a slit or a plurality of holes provided on a side wall of the ultrasonic propagation tube for discharging the cleaning liquid, and the ultrasonic propagation tube is inserted into the cleaning tank, and the cleaning liquid is discharged from the slit or the plurality of holes into the cleaning tank.

The above ultrasonic cleaning device flows the cleaning liquid provided with the ultrasonic energy by the ultrasonic transducer through the ultrasonic propagation tube, and discharges the cleaning liquid from the slit or the plurality of holes provided on the side wall of the ultrasonic propagation tube into the cleaning tank. As a result, the object to be cleaned immersed in the cleaning liquid in the cleaning tank can be cleaned by the cleaning liquid and the ultrasonic energy.

Also, the ultrasonic cleaning device according to the present invention can further comprise: a housing for housing one end of the ultrasonic propagation tube and the ultrasonic transducer disposed so as to oppose the one end;

a cleaning liquid supply device for supplying the cleaning liquid into the housing;

a dissolved gas concentration adjuster for adjusting a dissolved gas concentration of the cleaning liquid;

a cleaning liquid recovery tank for recovering the cleaning liquid overflowed from an upper part of the cleaning device; and a circulation pump for supplying the cleaning liquid in the cleaning liquid recovery tank into the housing again.

An ultrasonic cleaning device according to the present invention comprises:

an ultrasonic transducer for providing ultrasonic energy to a cleaning liquid;

an ultrasonic propagation tube for flowing the cleaning liquid provided with the ultrasonic energy by the ultrasonic transducer;

a slit or a plurality of holes provided on a side surface of the ultrasonic propagation tube for discharging the cleaning liquid;

a holding mechanism for holding an object to be cleaned so as to oppose the slit or the plurality of holes; and a moving mechanism for relatively moving the object to be cleaned held by the holding mechanism and the ultrasonic propagation tube, and the cleaning device cleans the object to be cleaned by discharging the cleaning liquid provided with the ultrasonic energy to the object to be cleaned from the slit or the plurality of holes while relatively moving the object to be cleaned and the ultrasonic propagation tube by the moving mechanism.

Also, in the ultrasonic cleaning device according to the present invention, the object to be cleaned can be inclined and held by the holding mechanism.

BRIEF DESCRIPTION OF THE DRAWINGS

FIG. 14(A) is a sectional view illustrating an ultrasonic propagation tube and a cleaning liquid supply mechanism according to a variation 14 of the embodiment 1, and FIG. 14(B) is a sectional view illustrating a state in which the ultrasonic propagation tube and the cleaning liquid supply mechanism shown in FIG. 14A are disposed above the object to be cleaned. FIG. 14(C) is a sectional view illustrating a state in which the ultrasonic propagation tube and the cleaning liquid supply mechanism are disposed above the object to be cleaned.

FIG. 15 is a sectional view illustrating an ultrasonic propagation tube according to a variation 16 of the embodiment 1.

Figure 1:
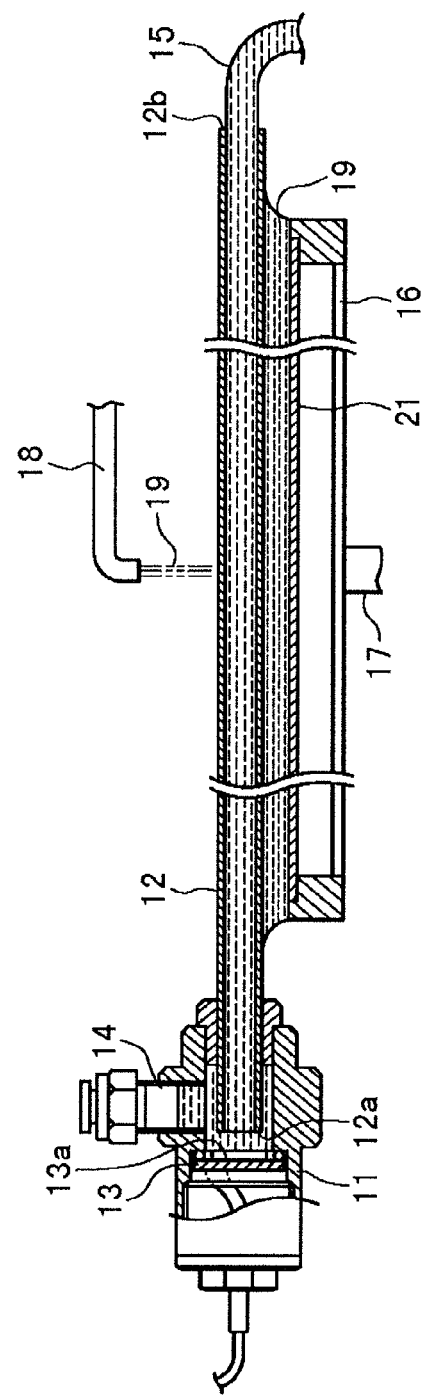
FIG. 1 is a sectional view illustrating an ultrasonic cleaning device according to an embodiment 1 of the present invention.

EXPLANATION OF REFERENCE NUMERALS 11 case (housing)
12, 37, 40, 42 to 53, 55, 63 ultrasonic propagation tube
12a, 44a to 46a rear end portion
12b, 47b front end portion
13 ultrasonic transducer
13a disk-shaped oscillation plate
14 propagation liquid supply port
15 propagation liquid
16 stage
17 rotation support portion
18 cleaning liquid supply nozzle
19, 57 cleaning liquid
20 propagation liquid supply device
21 object to be cleaned
22 dissolved gas concentration adjuster
23 temperature adjuster
24 flow meter
25 joint
26 drain tube
27 propagation liquid recovery tank
28 circulation pump
29 filter
30 oscillator
32 sound pressure sensor
33 sound pressure meter
34 CPU
35 cleaning liquid recovery tank
36 drain
38 round hole
39 cleaning liquid
39a liquid film
41 slit (groove)
42a, 42b tube wall
44b, 45b flange portion
46b tapered shape
47a attenuator
54 cleaning liquid supply pipe
54a introduction port
54b round hole
55a inner tube
55b outer tube
55a1 distal end (front end portion)
55b1 distal end (front end portion)
55b2 discharge port
56 cleaning tank
56a drain port
58 carrier (transporting unit)
58a receiver portion
59 semiconductor wafer
60 cleaning liquid inlet
61 cleaning liquid recovery tank
62 cleaning liquid supply device
64 large substrate
65 transporting shaft
66 transporting roller

DETAILED DESCRIPTION OF THE PREFERRED EMBODIMENTS

Embodiments of the present invention will be described below in detail using the attached drawings. However, it is easily understood by those skilled in the art that the present invention is not limited to the following description and its modes and details can be modified in various ways without departing from the gist and scope of the present invention. Therefore, the present invention should not be interpreted with limitation to the described contents of the embodiments shown below.

Single-Wafer Spin Cleaning

Embodiment 1

Figure 2:
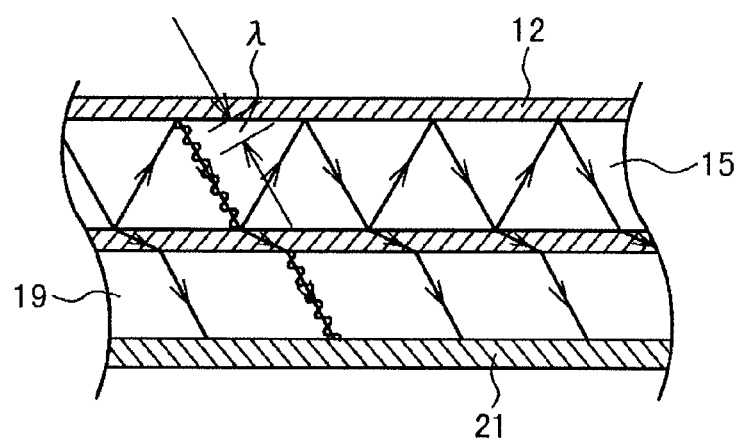
FIG. 2 is a sectional view enlarging a part of an ultrasonic propagation tube and an object to be cleaned shown in FIG. 1.
Figure 3:
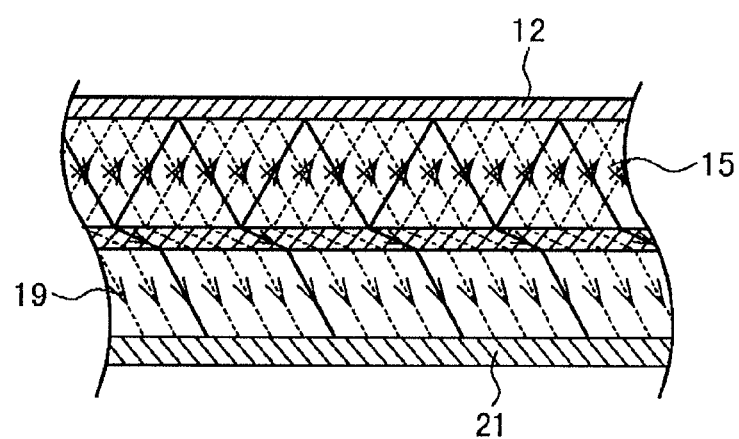
FIG. 3 is a sectional view enlarging a part of the ultrasonic propagation tube and the object to be cleaned shown in FIG. 1.

FIG. 1 is a sectional view illustrating an ultrasonic cleaning device according to an embodiment 1 of the present invention. FIGS. 2 and 3 are sectional views enlarging a part of an ultrasonic propagation tube 12 and an object to be cleaned 21 shown in FIG. 1.

The ultrasonic cleaning device shown in FIG. 1 has a case (housing) 11, and the ultrasonic propagation tube 12 is mounted at a distal end portion of the case (housing) 11. A material of this ultrasonic propagation tube 12 is an inactive non-contaminant such as quartz, which can easily prevent contamination from a liquid contact portion. Since a solution containing hydrofluoric acid has an action to etch quartz, if a solution containing hydrofluoric acid is to be used as a cleaning liquid, sapphire, silicon carbide or high purity aluminum ($Al_2O_3$) may be used or quartz coated with a substance resistant against the hydrofluoric acid solution such as silicon carbide, high purity aluminum ($Al_2O_3$), PFA of fluorine resin and the like may be used as a material of the ultrasonic propagation tube 12. Since quartz, sapphire and silicon carbide are vulnerable to impact and expensive, stainless steel such as SUS316L may be used. If a problem of chemical resistance or elution of metal contamination is worried in manufacture of the ultrasonic propagation tube of stainless steel, electrolytic polishing or surface modification processing can be applied to the ultrasonic propagation tube.

Within the case (housing) 11, a disk-shaped ultrasonic transducer 13 is placed opposing a rear end portion 12a of the ultrasonic propagation tube 12. This ultrasonic transducer 13 has a disk-shaped oscillation plate 13a in an integral configuration, and the surface of the oscillation plate 13a opposes the rear end portion 12a of the ultrasonic propagation tube 12 as an oscillating surface of the ultrasonic transducer 13. Also, in a side surface of the case 11, a propagation liquid supply port 14 for supplying a propagation liquid 15 for propagating an ultrasonic wave is formed, and deionized water at a room temperature is preferably used, for example, for the propagation liquid 15.

Also, the ultrasonic cleaning device has a stage 16 for holding an object to be cleaned 21 having a flat plane such as a semiconductor wafer, and a rotation support portion 17 is mounted below the stage 16. On this rotation support portion 17, a rotating mechanism (not shown) for rotating the rotation support portion 17 is mounted.

Above the stage 16, a cleaning liquid supply nozzle 18 for supplying a cleaning liquid 19 is disposed, and the cleaning liquid 19 is supplied to the surface of the object to be cleaned 21 by this cleaning liquid supply nozzle 18. The ultrasonic propagation tube 12 contacts the cleaning liquid 19 supplied to the surface of the object to be cleaned 21. That is, the ultrasonic propagation tube 12 is disposed at a height in contact with a liquid film (cleaning liquid) 19 on the surface of the object to be cleaned 21 and is extended from one outer periphery to the other outer periphery of the object to be cleaned 21. A front end portion 12b of the ultrasonic propagation tube 12 is disposed outside the other outer periphery so that the propagation liquid 15 is discharged from the front end portion 12b.

Next, an operation of the ultrasonic cleaning device shown in FIG. 1 will be described.

The cleaning device holds object to be cleaned 21 on the stage 16, and supplies the cleaning liquid 19 to the surface of the object to be cleaned 21 from the cleaning liquid supply nozzle 18, while rotating the object to be cleaned 21 by rotating the stage 16. Also, the cleaning device supplies the propagation liquid to the ultrasonic transducer 13 inside the case (housing) 11 from the propagation liquid supply port 14, flows the propagation liquid 15 provided with an ultrasonic wave by the ultrasonic transducer 13 from the rear end portion 12a to the front end portion 12b of the ultrasonic propagation tube 12, and discharges the propagation liquid 15 from the front end portion 12b, which is an open end.

A wavelength λ of the ultrasonic wave propagating in deionized water, which is the propagation liquid 15, flowing inside the ultrasonic propagation tube 12 as shown in FIG. 2 is acquired by λ=V/F from a sonic speed V=1500 m/s in the deionized water and an operating frequency F=1 MHz, and by calculating this, the wavelength λ=1.5 mm is acquired. This ultrasonic wave repeats reflection and propagates inside the ultrasonic propagation tube 12 but a part thereof transmits through the ultrasonic propagation tube 12, propagates in the cleaning liquid 19, and reaches the object to be cleaned 21. As a result, the surface of the object to be cleaned 21 is cleaned by the ultrasonic wave and the cleaning liquid 19.

In the above embodiment 1, the propagation liquid 15 makes ultrasonic oscillation propagate within it and also works as a refrigerant for removing heat from the ultrasonic transducer 13. Thus, cooling is performed efficiently, and since heat is not generated even if large energy is given to the ultrasonic transducer 13, the sonic speed V and the operating frequency F in the propagation liquid 15 having a temperature characteristic can be easily maintained constant.

Also, since the distal end (front end portion 12b) of the ultrasonic propagation tube 12 is an open end, as shown in FIG. 3, the ultrasonic wave propagating in the propagation liquid 15 becomes a continuous wave, and standing wave distribution is not caused. Thus, since there is no node in an oscillation amplitude as in the probe (solid rod)-type ultrasonic cleaning device in FIG. 25, uniform cleaning effects can be realized. Also, since there is no need to accurately determine the length of the ultrasonic propagation tube, manufacture of the device is easier as compared with the probe (solid rod)-type ultrasonic cleaning device.

Also, even if the ultrasonic propagation tube 12 is made longer in order to cope with an increase in diameter of the object to be cleaned 21, although the length of the propagation liquid 15 also becomes longer, there is little change in an acoustic load applied to the transducer of the deionized water, which is the propagation liquid 15. Thus, there is no limitation on the length of the ultrasonic propagation tube which can be driven, and a larger diameter of the object to be cleaned 21 can be easily handled.

Figure 24:
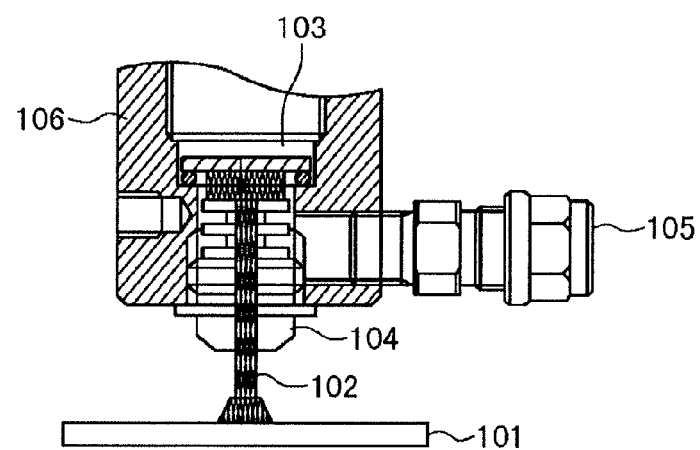
FIG. 24 is a sectional view illustrating a prior-art spot-shower type ultrasonic cleaning device for single-wafer spin cleaning.

Also, in the embodiment 1, since the ultrasonic irradiation region is on the line along the ultrasonic propagation tube 12, time required for cleaning the entire surface on the object to be cleaned 21 can be drastically reduced as compared with a point (spot) of the ultrasonic irradiation region of the ultrasonic cleaning device shown in FIG. 24. Also, there are merits that a mechanism for oscillating the ultrasonic propagation tube 12 is not needed, and the ultrasonic propagation tube 12 and the case 11 can be installed without requiring a large space.

Also, a liquid contact portion is only the ultrasonic propagation tube 12, and it is only necessary to select a member resistant against the cleaning liquid 19 only for the ultrasonic propagation tube 12. Also, by maintaining cleanliness of only the ultrasonic propagation tube 12, contamination from the member can be easily prevented.

Figure 25:
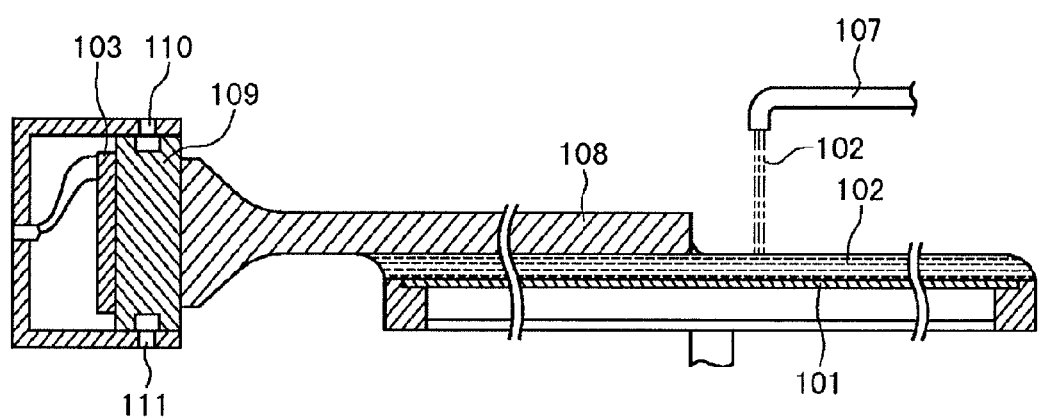
FIG. 25 is a sectional view illustrating a prior-art probe (solid rod) type ultrasonic cleaning device for single-wafer spin cleaning.
Figure 26:
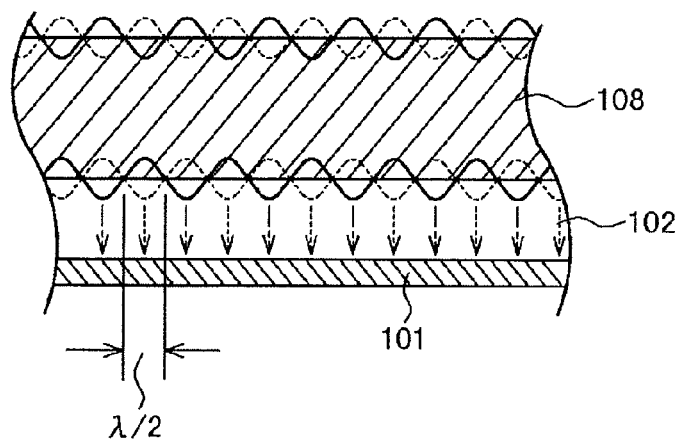
FIG. 26 is a diagram illustrating a standing wave distribution propagating in the probe (solid rod) shown in FIG. 25.

Also, in the ultrasonic cleaning device of the embodiment 1, ultrasonic oscillation is given to the propagation liquid 15 from the ultrasonic transducer 13, deionized water at a room temperature is used for the propagation liquid 15, and a density of the deionized water is approximately 1000 kg/m$^3$, which is smaller than a density of quartz at 2200 kg/m$^3$ forming the probe (solid rod) 108 shown in FIG. 25. Thus, an acoustic load applied on the ultrasonic transducer 13 can be made smaller than that of the device shown in FIG. 25, and heat generation of the ultrasonic transducer 13 can be reduced.

Also, there is an obvious difference as follows between the prior-art probe (solid rod) type ultrasonic cleaning device shown in FIG. 25 and the ultrasonic cleaning device of this embodiment.

The ultrasonic cleaning device shown in FIG. 25 is a device that oscillates the probe (solid rod) 108, which is a solid such as quartz and has a high density, by the ultrasonic transducer 103 through a heat conductive member 109 to make the probe (solid rod) itself work as a transducer having standing wave distribution, provides ultrasonic energy to the liquid film (cleaning liquid) 102 in contact with the probe (solid rod) 108 to make the liquid film 102 work as an energy propagation path, and supplies the ultrasonic energy to the object to be cleaned.

On the other hand, the ultrasonic cleaning device of this embodiment is a device in which the ultrasonic oscillation energy from the ultrasonic transducer 13 propagates to the propagation liquid 15 in the ultrasonic propagation tube 12, and the ultrasonic wave in the propagation liquid 15 propagates by repeating reflection in the ultrasonic propagation tube 12, while a part of ultrasonic wave transmits through the ultrasonic propagation tube 12, propagates to the cleaning liquid 19 and reaches the object to be cleaned 21. Therefore, the propagation liquid 15 filled in the ultrasonic propagation tube 12 is a propagation path for the ultrasonic energy from the ultrasonic transducer 13 but is not a transducer. The ultrasonic propagation tube 12 has a role to hold the propagation liquid 15 and to form the propagation path but is not a transducer.

The ultrasonic cleaning device of this embodiment does not provide megasonic energy to a cleaning fluid by the probe (solid rod) 108 as shown in FIG. 25. This will be described below in detail.

In the ultrasonic cleaning device of this embodiment, the propagation liquid 15 provided with an ultrasonic wave flows from the rear end portion 12a toward the front end portion 12b of the ultrasonic propagation tube 12, and a part of the ultrasonic wave propagating in the propagation liquid 15 transmits through the ultrasonic propagation tube 12 and propagates into the cleaning liquid 19. Therefore, from the functional viewpoint, the probe for providing the ultrasonic wave to the cleaning liquid may correspond to the propagation liquid 15 flowing through the ultrasonic propagation tube 12.

However, the probe (solid rod) 108 shown in FIG. 25 is a probe made of a solid and not a probe made of a liquid.

Also, the ultrasonic propagation tube 12 of this embodiment does not correspond to the probe (solid rod) 108 shown in FIG. 25. This will be described below in detail.

The ultrasonic propagation tube 12 does not contact the oscillation plate 13a as shown in FIG. 1, and the propagation liquid 15 exists between the surface of the oscillation plate 13a and the rear end portion 12a of the ultrasonic propagation tube 12. Therefore, the ultrasonic wave from the oscillation plate 13a is not directly transmitted to the ultrasonic propagation tube 12. Since the ultrasonic propagation tube 12 does not provide the ultrasonic wave to the cleaning liquid as above, the ultrasonic propagation tube 12 does not correspond to the probe (solid rod) shown in FIG. 25.

Next, a sound pressure when a part of the ultrasonic wave propagating in the propagation liquid 15 flowing through the ultrasonic propagation tube 12 transmits through the ultrasonic propagation tube 12 and propagates into the cleaning liquid 19 (hereinafter referred to as "sound pressure of this embodiment") and a sound pressure when the megasonic energy is provided to the cleaning fluid by the probe (solid rod) 108 shown in FIG. 25 (hereinafter referred to as "sound pressure of the prior art") will be described.

The sound pressure of this embodiment and the sound pressure of the prior art are totally different from each other from the following reasons.

In this embodiment, since the distal end (front end portion 12b) of the ultrasonic propagation tube 12 is made open for flowing the propagation liquid 15, the ultrasonic wave propagating in the propagation liquid 15 becomes a continuous wave having traveling wave distribution, and standing wave distribution is not caused as shown in FIG. 3. On the other hand, in the probe (solid rod) 108 shown in FIG. 25, since this probe (solid rod) 108 is solid, standing wave distribution is caused by a reflective wave from the distal end (free end) of the probe (solid rod).

Figure 28:
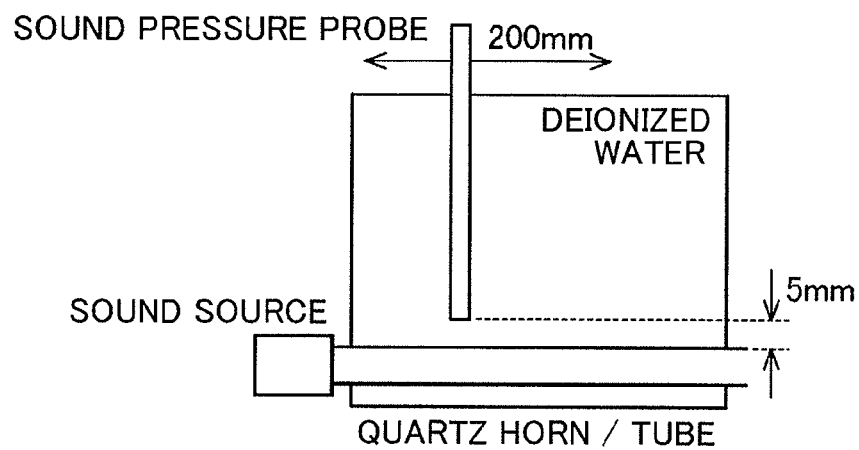
FIG. 28 is a schematic diagram illustrating a method for measuring a sound pressure of this embodiment and a sound pressure of a prior art, respectively.
Figure 29:
FIG. 29 is a photo showing an entire device when the sound pressure of this embodiment and the sound pressure of the prior art are measured, respectively.
Figure 30:
FIG. 30 is a photo showing a tube portion of the device when the sound pressure of this embodiment and the sound pressure of the prior art are measured, respectively.

In order to prove the above contents, an experiment was conducted for measuring the sound pressure of this embodiment and the sound pressure of the prior art, respectively. The measuring method of the sound pressure is shown in FIG. 28, and photos at the measurement are shown in FIGS. 29 and 30 and the measurement results in FIG. 31.

The measurement conditions are as follows:
water temperature: room temperature (approximately 20° C.)
water quality: deaerated water (DO 1 ppm or less)
flow rate of this invention: 1.0 L/min
tank water supply rate: 5 to 7 L/min
tank capacity: 250×250×400 mm
input power: 30 W
oscillation frequency: 950 kHz
number of measurement times: 2 (average value)
tube diameter: φ6 mm (inner diameter φ4)

Figure 31:
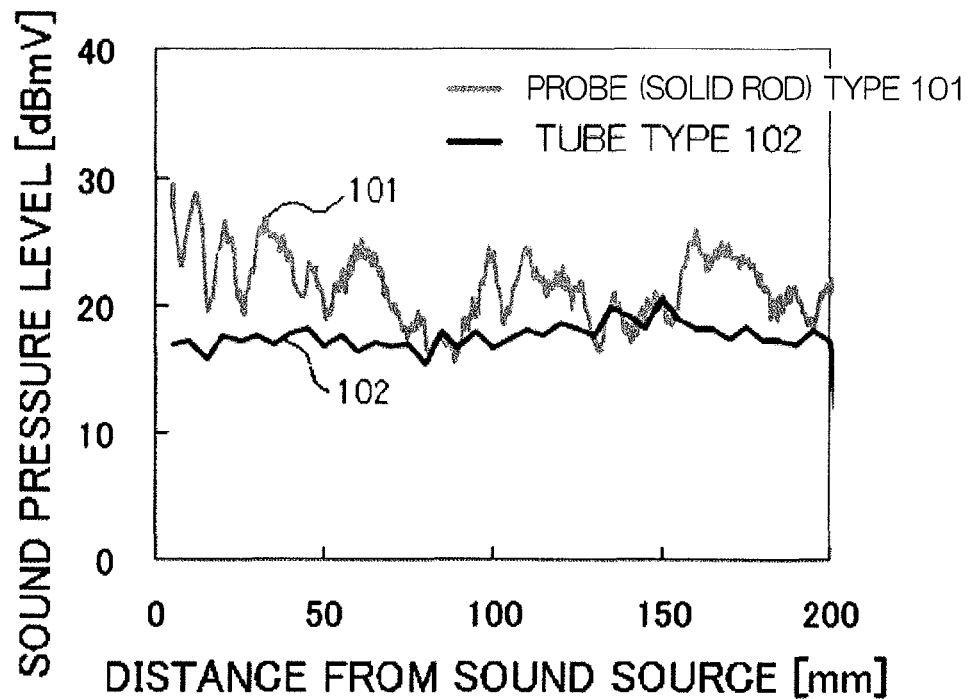
FIG. 31 is a graph illustrating measurement results of the sound pressure of this embodiment and the sound pressure of the prior art measured, respectively.

As shown in FIG. 31, the sound pressure of this embodiment is confirmed as a continuous wave traveling with a substantially constant amplitude (see 102), while with the sound pressure of the prior art, it is confirmed that the amplitude has an attenuating tendency but an amplitude value thereof is larger than that of the sound pressure of this embodiment and represents standing wave distribution (see 101). That is, if a difference between the minimum amplitude and the maximum amplitude is small, it represents traveling wave distribution, while the difference between the minimum amplitude and the maximum amplitude is large, it represents standing wave distribution. With regard to the sound pressure of this embodiment, the difference between the minimum amplitude and the maximum amplitude is small, and it represents traveling wave distribution. Also, the amplitude is substantially constant, and no attenuating tendency is found. With regard to the sound pressure of the prior art, the difference between the minimum amplitude and the maximum amplitude is large, and it represents standing wave distribution. Also, the amplitude shows an attenuating tendency.

Figure 32:
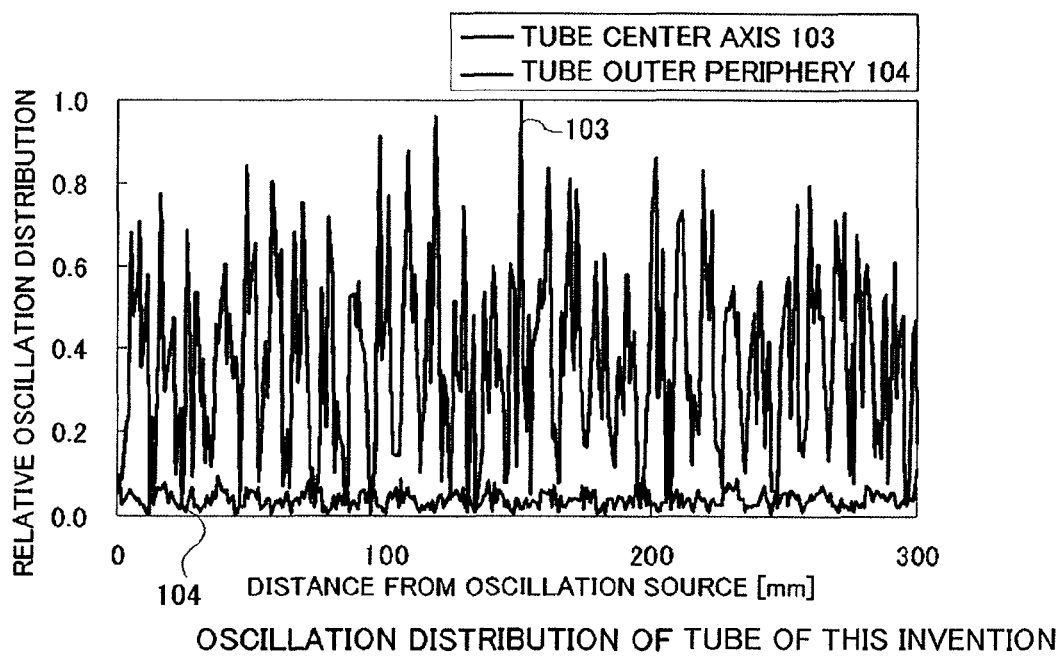
FIG. 32 is a graph for showing oscillation propagation comparison simulation of a prior art solid rod and a tube of this invention and illustrates oscillation distribution of ultrasonic propagation tube of this invention.
Figure 33:
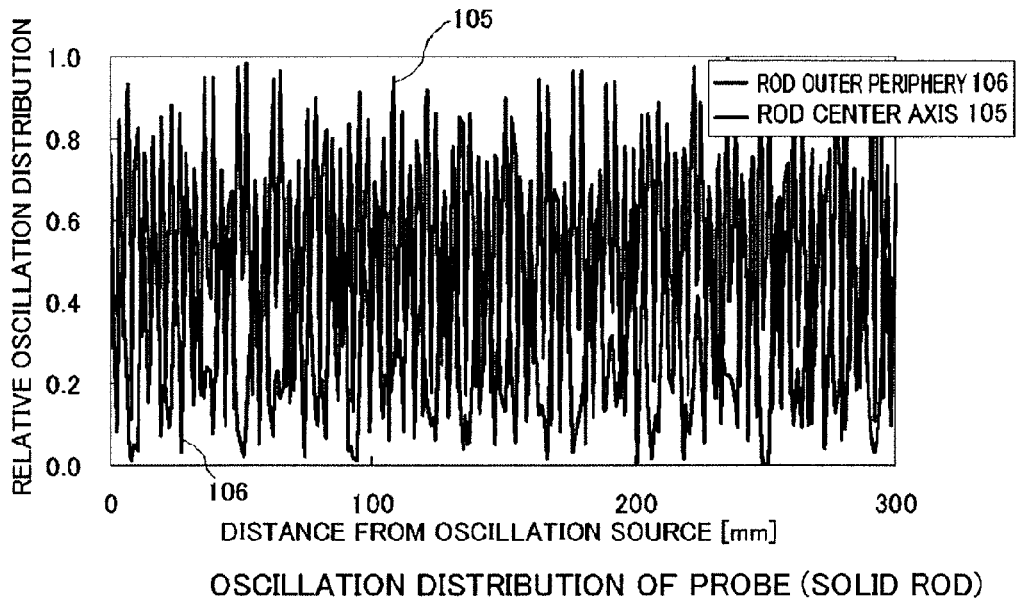
FIG. 33 is a graph for showing oscillation propagation comparison simulation of a prior art solid rod and a tube of this invention and illustrates oscillation distribution of a prior art solid rod.
Figure 34:
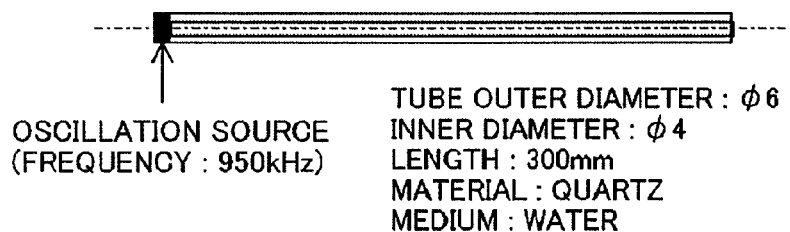
FIG. 34 is a diagram illustrating conditions of the simulation of the ultrasonic propagation tube of this invention.
Figure 35:
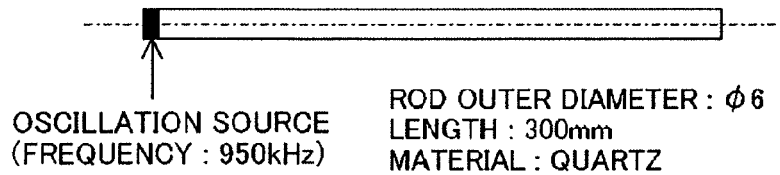
FIG. 35 is a diagram illustrating conditions of the simulation of the prior art solid rod.

(attenuation)
probe (solid rod): attenuating from 30 dB to 20 dB
load is large for quartz horn
tube: constant approximately at 20 dB
load is small for deionized water tube
(Distribution)
probe (solid rod): distribution is caused
propagating with standing wave (wavelength: 6 mm)
tube: distribution is not caused
propagating with traveling wave Moreover, in order to prove the above contents, simulation was conducted to compare oscillation propagation of the probe (solid rod) shown in FIG. 25 and the oscillation propagation of the propagation liquid 15 flowing through the ultrasonic propagation tube 12 of this embodiment, and simulation results are shown in FIGS. 32 and 33 and simulation conditions in FIGS. 34 and 35.

As shown in FIG. 33, in the case of the probe (solid rod) shown in FIG. 25, no large difference is found in the oscillation amplitude between the center portion (see 105) and the outer periphery portion (see 106) of the probe (solid rod), and it shows that the oscillation is propagated in the entire probe (solid rod). On the other hand, as shown in FIG. 32, in the case of this embodiment, it is known that the oscillation is propagated mainly by a medium (water) (see 103). Therefore, the both are fundamentally different in terms of a system of oscillation propagation. In this way, the sound pressure of this embodiment is totally different from that of the prior art.

With regard to the cleaning liquid 19, various cleaning liquids can be used depending on the object to be cleaned 21, and other than deionized water and functional water in which a gas for improving a cleaning effect (nitrogen, hydrogen, helium, ozone and the like) or a gas having an antistatic action (carbon dioxide) is added to deionized water, ammonia hydrogen peroxide solution with the purpose of removing particles, dilute hydrofluoric acid with an etching action, potassium chloride (KOH), a stripper liquid for removing a resist film and the like can be used.

Figure 4:
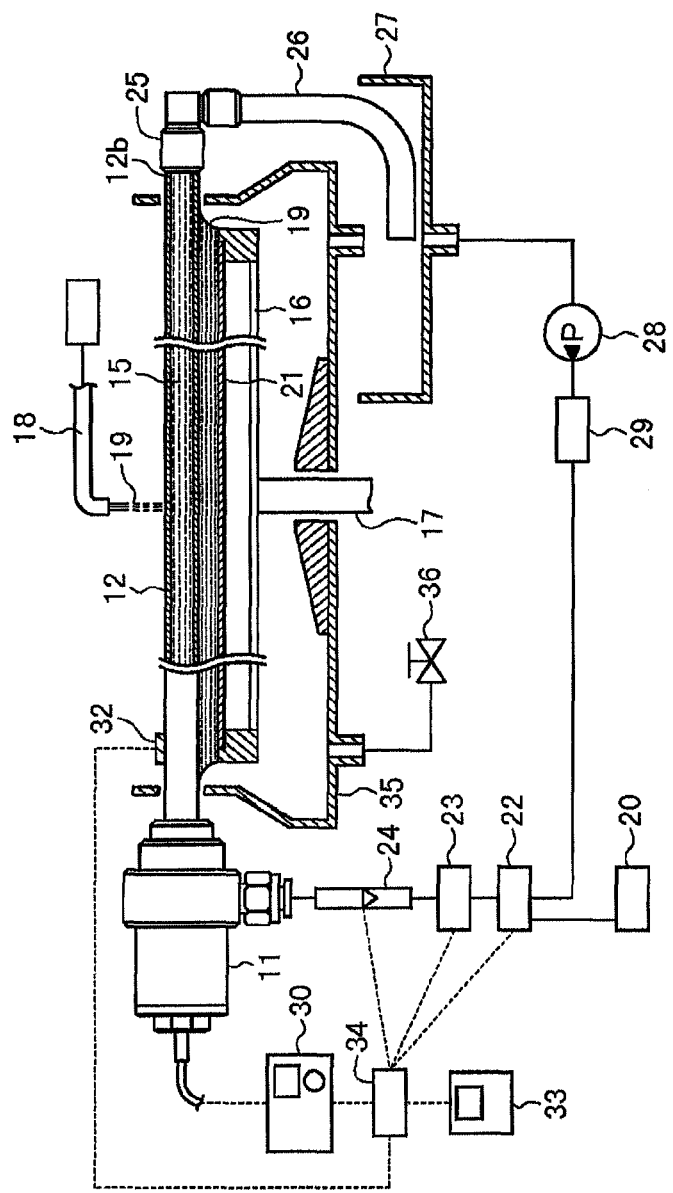
FIG. 4 is a configuration diagram illustrating a system of the ultrasonic cleaning device of the embodiment 1 of the present invention.

Next, an example in which the ultrasonic cleaning device shown in FIG. 1 is systemized will be described referring to FIG. 4. FIG. 4 is a configuration diagram illustrating a system of the ultrasonic cleaning device of the embodiment 1, and the same reference numerals are given to the same portions as those in FIG. 1.

As shown in FIG. 4, the propagation liquid supplied from the propagation liquid supply device 20 is supplied to the ultrasonic propagation tube 12 through a dissolved gas concentration adjuster 22, a temperature adjuster 23, and a flow meter 24. Here, it is possible to set characteristics (dissolved gas concentration, temperature, and flow rate) of the propagation liquid 15 to conditions suitable for the cleaning.

At a distal end (front end portion 12b) of the ultrasonic propagation tube 12, a joint 25 and a drain tube 26 are mounted. As a result, the propagation liquid 15 is fed to a propagation liquid recovery tank 27. The propagation liquid 15 recovered in the propagation liquid recovery tank 27 can be circulated by a circulation pump 28. The propagation liquid 15 having passed through the circulation pump 28 is regenerated through a filter 29. The regenerated propagation liquid 15 is supplied to the ultrasonic propagation tube 12 through the dissolved gas concentration adjuster 22, the temperature adjuster 23, and the flow meter 24, which is the same path as that described above.

Electrical power is supplied to the ultrasonic transducer by the oscillator 30, an ultrasonic wave is provided to the propagation liquid by the ultrasonic transducer, and ultrasonic energy is propagated to the propagation liquid 15 filled in the ultrasonic propagation tube 12.

The cleaning liquid supplied from the cleaning liquid supply device is supplied onto the ultrasonic propagation tube 12 or onto the object to be cleaned 21, and a liquid film (cleaning liquid) 19 in contact with the ultrasonic propagation tube 12 is formed on the object to be cleaned 21. At this time, the object to be cleaned 21 is rotated together with the stage 16. The ultrasonic energy transmitted through the ultrasonic propagation tube 12 propagates in the cleaning liquid 19 and reaches the object to be cleaned 21. As a result, the surface of the object to be cleaned 21 is cleaned by the ultrasonic wave and the cleaning liquid 19. The cleaning liquid 19 after cleaning is recovered in the cleaning liquid recovery tank 35 and discharged to a drain 36.

A sound pressure sensor 32 is mounted on a side surface of the ultrasonic propagation tube 12, and the ultrasonic energy transmitted through the ultrasonic propagation tube 12 is detected by this sound pressure sensor 32. Data of the detected ultrasonic energy is sent to a sound pressure meter 33 through a CPU 34, converted to a voltage value at the sound pressure meter 33 and sent to the CPU 34. An output voltage value of the oscillator 30 has been also sent to the CPU 34 at the same time, and if the sound pressure value (voltage value of the ultrasonic energy) is lower than the output voltage value, it can be determined that the ultrasonic energy has been lowered. The characteristics of the propagation liquid 15 (dissolved gas concentration, temperature, and flow rate) are also sent as data to the CPU 34 from the dissolved gas concentration adjuster 22, the temperature adjuster 23, and the flow meter 24, respectively. The CPU 34 can make a control to start oscillation after confirming that the data has reached a predetermined value. As a result, empty operation particularly caused by a lowered flow rate can be prevented.

Depending on the type of the cleaning liquid 19, the temperature may be raised to approximately 70° C., and in that case, in order to maintain cleaning quality, the temperature is preferably kept constant. Thus, by raising the temperature of the propagation liquid 15 to approximately 70° C. by the temperature adjuster 23, temperature drop of the cleaning liquid 15 in contact with the ultrasonic propagation tube 12 can be prevented. Temperature rise of the ultrasonic transducer during operation is approximately a liquid temperature +20° C. With the liquid temperature of 70° C., the temperature of the ultrasonic transducer becomes 90° C. Because an allowable temperature of the ultrasonic transducer is approximately 120° C., there is no problem in use.

Figure 5:
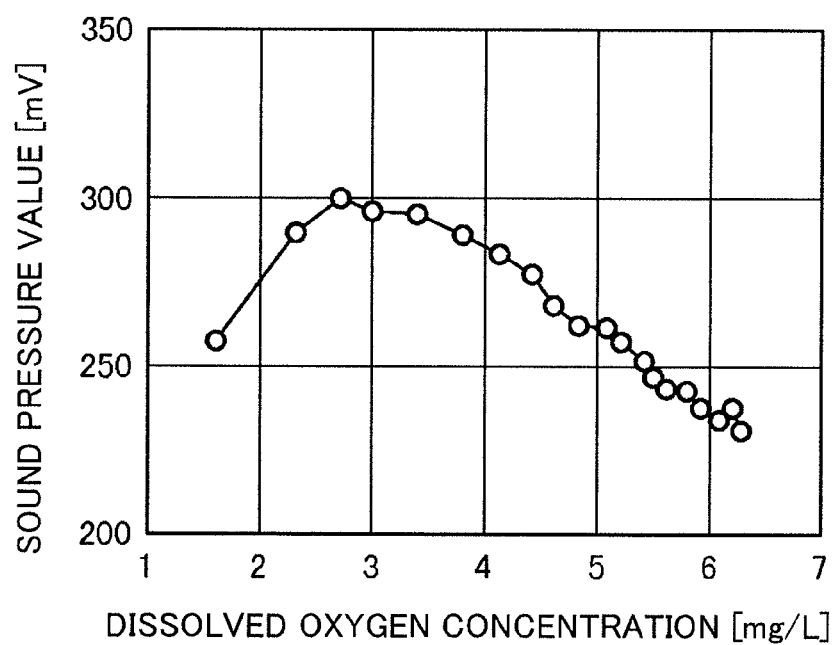
FIG. 5 is a graph illustrating a relationship between a dissolved gas concentration in deionized water and a sound pressure value.

FIG. 5 is a graph illustrating a relationship between a dissolved gas concentration in deionized water and a sound pressure value (voltage value of ultrasonic energy). Although the gas concentration dissolved in deionized water as propagation liquid is usually approximately 7 to 8 ppm for dissolved oxygen concentration, a high cleaning effect can be obtained as shown in FIG. 5, by adjusting the dissolved oxygen concentration to 2 to 4.5 ppm (more preferably 2 to 3 ppm) at which a high sound pressure value can be obtained. Therefore, with the ultrasonic cleaning device shown in FIG. 4, the dissolved gas concentration adjuster 22 is preferably controlled by the CPU 34 so that the dissolved oxygen concentration in the deionized water as the propagation liquid is adjusted to 2 to 3 ppm.

Embodiment 2

Figure 6:
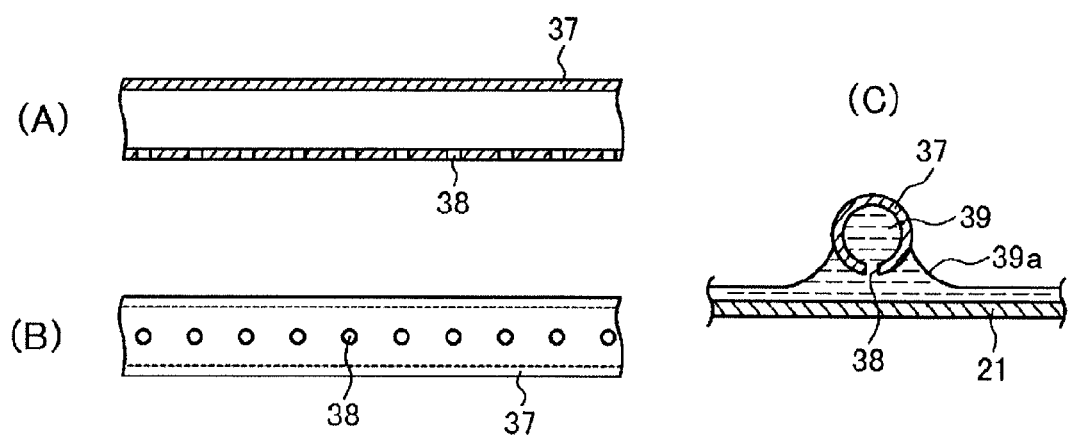
FIG. 6(A) is a sectional view illustrating an ultrasonic propagation tube of an ultrasonic cleaning device according to an embodiment 2 of the present invention.
FIG. 6(B) is a view of the ultrasonic propagation tube shown in FIG. 6(A) seen from below.
FIG. 6(C) is a sectional view illustrating a state in which the ultrasonic propagation tube shown in FIGS. 6(A) and 6(B) is disposed on the object to be cleaned during cleaning.

FIG. 6(A) is a sectional view illustrating an ultrasonic propagation tube of an ultrasonic cleaning device according to an embodiment 2 of the present invention, FIG. 6(B) is a view of the ultrasonic propagation tube shown in FIG. 6(A) seen from below, and FIG. 6(C) is a sectional view illustrating a state in which the ultrasonic propagation tube shown in FIGS. 6(A) and 6(B) is arranged on the object to be cleaned 21.

In the ultrasonic cleaning device of the embodiment 1 shown in FIG. 1, the propagation liquid 15 and the cleaning liquid 19 are configured to be separated from each other, but in the ultrasonic cleaning device of the embodiment 2, the cleaning liquid is used as the propagation liquid, and the propagation liquid and the cleaning liquid are configured to be made common. That is, in the ultrasonic cleaning device according to the embodiment 2, the ultrasonic propagation tube 12 of the ultrasonic cleaning device shown in FIG. 1 is replaced by an ultrasonic propagation tube 37 shown in FIGS. 6(A) to 6(C), and the cleaning liquid supply nozzle 18 is eliminated.

As shown in FIGS. 6A and 6B, round holes 38 aligned in a single row are provided on a side surface of the ultrasonic propagation tube 37, and as shown in FIG. 6C, the ultrasonic propagation tube 37 is disposed in proximity above the object to be cleaned 21 in the ultrasonic cleaning device. In the ultrasonic propagation tube 37, a cleaning liquid 39 as a propagation liquid provided with ultrasonic energy is made to flow, and the cleaning liquid 39 is discharged onto the object to be cleaned 21 through the round holes 38. That is, the ultrasonic energy is discharged together with the cleaning liquid 39 onto the object to be cleaned 21 through the round holes 38. As a result, a liquid film 39a formed from the cleaning liquid 39 in contact with the ultrasonic propagation tube 37 is formed on the object to be cleaned 21, and the ultrasonic energy cleans the object while being supplied to the object to be cleaned 21 through the liquid film 39a.

In the embodiment 2, the effect similar to that of the embodiment 1 can be also obtained.

Also, since the cleaning liquid is used as the propagation liquid, it is not necessary to provide a device for supplying the cleaning liquid separately from the propagation liquid supply device.

(Variation)

Figure 7:
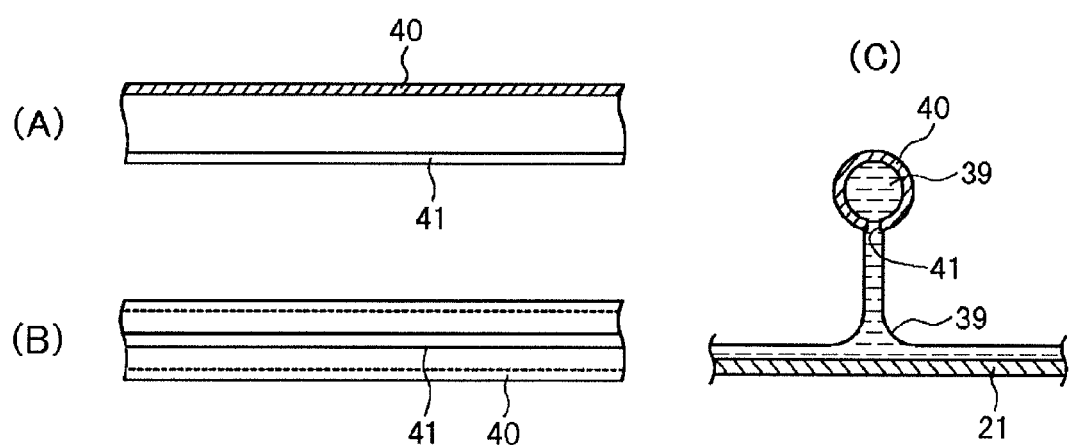
FIG. 7(A) is a sectional view illustrating a variation 1 of the ultrasonic propagation tube shown in FIG. 6(A)
FIG. 7(B) is a view of the ultrasonic propagation tube shown in FIG. 7(A) seen from below.
FIG. 7(C) is a sectional view illustrating a state in which the ultrasonic propagation tube shown in FIGS. 7(A) and 7(B) is disposed on the object to be cleaned during cleaning.

FIG. 7(A) is a sectional view illustrating a variation 1 of an ultrasonic propagation tube shown in FIG. 6(A), FIG. 7(B) is a view of the ultrasonic propagation tube shown in FIG. 7(A) seen from below, and FIG. 7(C) is a sectional view illustrating a state where the ultrasonic propagation tube shown in FIGS. 7(A) and 7(B) are disposed above the object to be cleaned 21 for cleaning.

As shown in FIGS. 7(A) and 7(B), a slit (groove) 41 formed on a single line is provided in a side surface of an ultrasonic propagation tube 40, and as shown in FIG. 7(C), the ultrasonic propagation tube 40 is disposed above the object to be cleaned 21 in the ultrasonic cleaning device, which is farther away from each other as compared with FIG. 6C. In the ultrasonic propagation tube 40, the cleaning liquid 39 as a propagation liquid provided with ultrasonic energy is made to flow, and the cleaning liquid 39 is discharged onto the object to be cleaned 21 through the slit 41. As a result, the ultrasonic energy is supplied to the object to be cleaned 21 through the cleaning liquid 39 and the object is cleaned. At this time, since the ultrasonic propagation tube 40 and the object to be cleaned 21 are arranged farther away from each other as compared with FIG. 6C, the ultrasonic propagation tube 40 does not contact a liquid film formed from the cleaning liquid 39 on the object to be cleaned 21.

In the variation 1 also, the effect similar to that of the embodiment 2 can be obtained.

Also, the ultrasonic propagation tube 37 shown in FIGS. 6(A) and 6(B) may be disposed so as not to contact the liquid film as shown in FIG. 7(C) or the ultrasonic propagation tube 40 shown in FIGS. 7A and 7B may be disposed so as to contact the liquid film as shown in FIG. 6(C).

Figure 8:
FIG. 8 is a sectional view illustrating an ultrasonic propagation tube according to a variation 2.

FIG. 8 is a sectional view illustrating an ultrasonic propagation tube according to a variation 2. The ultrasonic propagation tubes in each of the embodiments 1, 2, and the variation 1 may be changed to an ultrasonic propagation tube 42 shown in FIG. 8 and put into practice. This ultrasonic propagation tube 42 has a tube wall 42a having a thickness transmitting an ultrasonic wave and a tube wall 42b having a thickness not transmitting the ultrasonic wave. As a result, in the ultrasonic propagation tube 42, a region transmitting the ultrasonic wave and a region not transmitting the one are provided.

Figure 9:
FIG. 9 is a sectional view illustrating an ultrasonic propagation tube according to a variation 3.

FIG. 9 is a sectional view illustrating an ultrasonic propagation tube according to a variation 3. The ultrasonic propagation tubes in each of the embodiments 1, 2, and the variation 1 may be changed to an ultrasonic propagation tube 43 shown in FIG. 9 and put into practice. This ultrasonic propagation tube 43 has a tube 43a constructed by a material having a density transmitting an ultrasonic wave and a covering tube 43b covering a part of the tube 43a, and the covering tube 43b is constructed by a material having a density not transmitting the ultrasonic wave.

Figure 10:
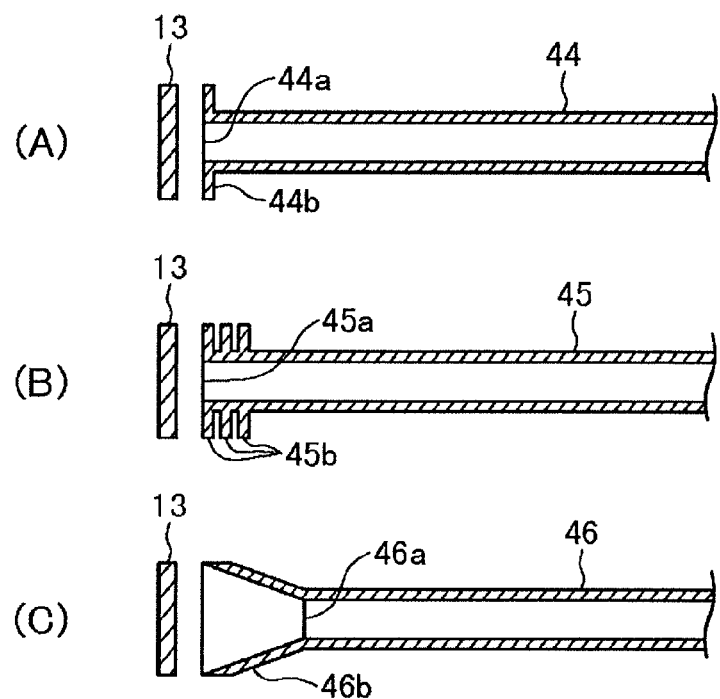
FIGS. 10(A) to 10(C) are sectional views illustrating ultrasonic propagation tube according to variations 4 to 6, respectively.

FIGS. 10(A) to 10(C) are sectional views illustrating ultrasonic propagation tubes according to variations 4 to 6, respectively. The ultrasonic propagation tubes in the embodiments 1, 2, and the variation 1 may be changed to ultrasonic propagation tubes 44 to 46 shown in FIGS. 10(A) to 10(C), respectively, and put into practice. In the ultrasonic propagation tubes 44 to 46, each of the distal ends (rear end portions 44a to 46a) has a shape that causes ultrasonic energy to efficiently propagate to the ultrasonic transducer 13 having a diameter larger than an outer diameter of the ultrasonic propagation tube.

At the rear end portion 44a of the ultrasonic propagation tube 44 shown in FIG. 10(A), a flange portion 44b is provided so as to oppose the ultrasonic transducer 13. By means of this flange portion 44b, the ultrasonic wave is multiply-reflected so that ultrasonic intensity can be increased.

At the rear end portion 45a of the ultrasonic propagation tube 45 shown in FIG. 10(B), a plurality of flange portions 45b is provided so as to oppose the ultrasonic transducer 13. By means of these flange portions 45b, the ultrasonic wave is multiply-reflected so as to increase the ultrasonic intensity, while a rectification effect of the propagation liquid can be provided.

The rear end portion 46a of the ultrasonic propagation tube 46 shown in FIG. 10(C) has a tapered shape 46b in which a tube inner diameter is getting larger as getting closer to the ultrasonic transducer 13. By means of this tapered shape 46b, the ultrasonic wave can be converged so as to increase the ultrasonic intensity.

Figure 11:
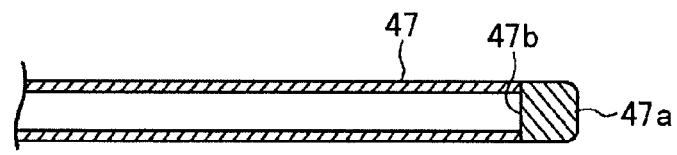
FIG. 11 is a sectional view illustrating an ultrasonic propagation tube according to a variation 7.

FIG. 11 is a sectional view illustrating an ultrasonic propagation tube according to a variation 7. The ultrasonic propagation tube in each of the embodiments 1, 2, and the variation 1 may be changed to an ultrasonic propagation tube 47 shown in FIG. 11 and put into practice. At a distal end (front end portion 47b) of this ultrasonic propagation tube 47, an attenuator 47a for absorbing ultrasonic energy is provided. The ultrasonic wave having reached the attenuator 47a is not reflected but absorbed by the attenuator 47a, and thereby the ultrasonic wave to be propagated becomes a continuous wave, and standing wave distribution is not caused. Thus, since a node of an oscillation amplitude as considered in the probe (solid rod)-type ultrasonic cleaning device in FIG. 25 is not present, uniformity of the cleaning effect can be realized.

Figure 12:
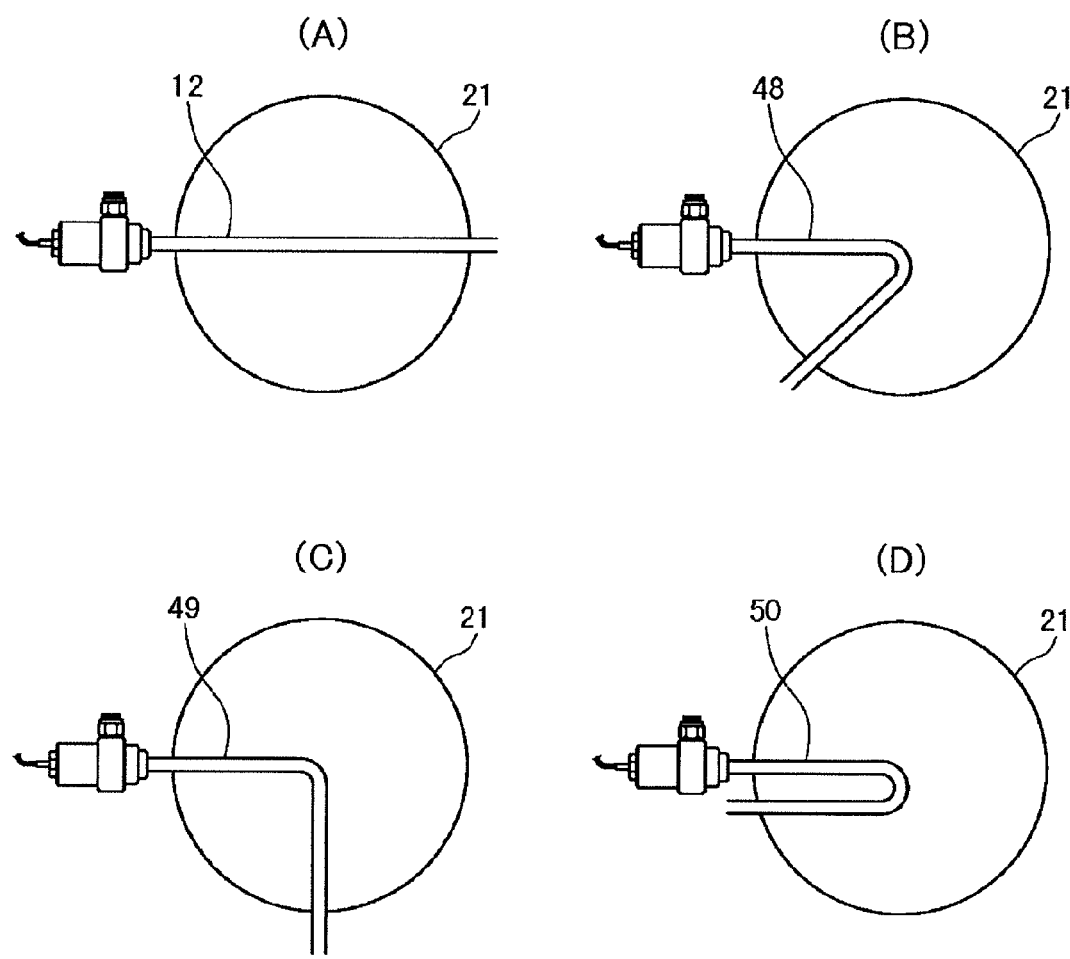
FIG. 12(A) is a plan view of arrangement of an object to be cleaned and an ultrasonic propagation tube in the ultrasonic cleaning device shown in FIG. 1 seen from above.
FIGS. 12(B) to 12(D) are plan views illustrating ultrasonic propagation tubes according to variations 8 to 10, respectively.

FIG. 12(A) is a plan view of arrangement of the object to be cleaned and the ultrasonic propagation tube in the ultrasonic cleaning device shown in FIG. 1 when seen from above, and FIGS. 12(B) to 12(D) are plan views illustrating ultrasonic propagation tubes according to variations 8 to 10, respectively.

As shown in FIG. 12(A), the ultrasonic propagation tube 12 according to the embodiment 1 has a linearly extending shape. On the other hand, as shown in FIGS. 12(B) to 12(D), the ultrasonic propagation tubes 48 to 50 according to the variations 8 to 10 have shapes bent at the center of the object to be cleaned 21. In detail, the ultrasonic propagation tube 48 shown in FIG. 12(B) is bent at a sharp angle, the ultrasonic propagation tube 49 shown in FIG. 12(C) is bent at a right angle, and the ultrasonic propagation tube 50 shown in FIG. 12(D) is bent so as to be folded back.

According to the variations 8 to 10, since the ultrasonic propagation tube can be manufactured by bending it to various shapes, design freedom in a device whose installation space is limited can be improved.

Figure 13:
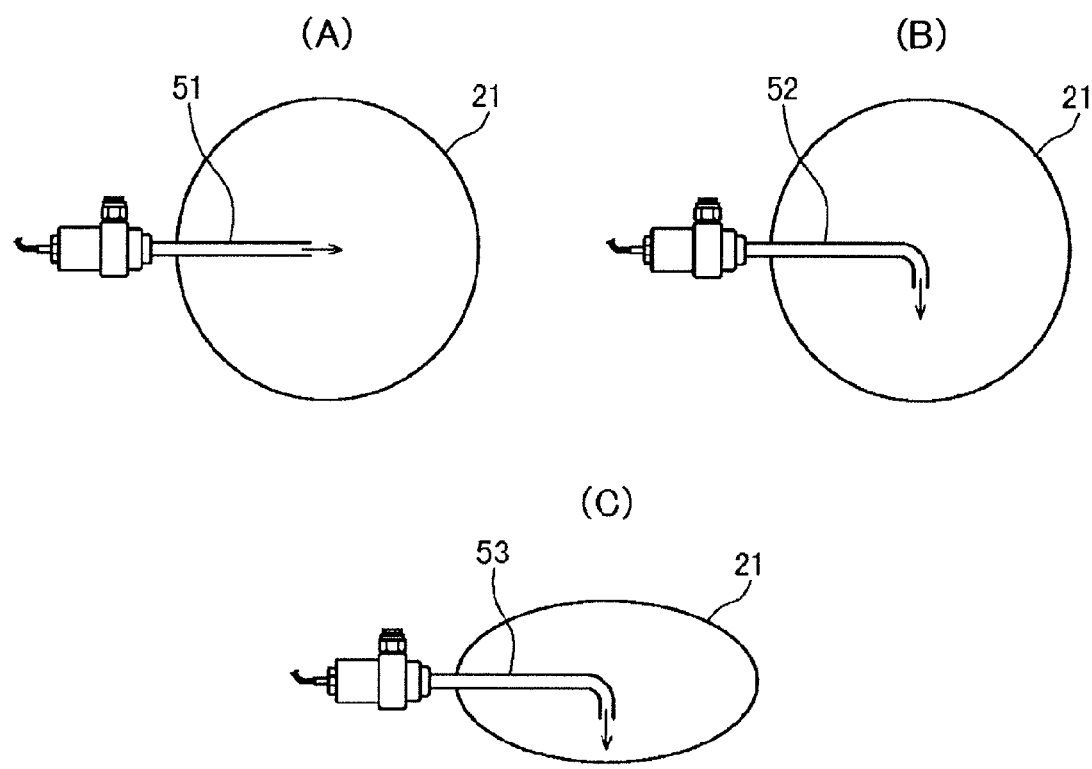
FIGS. 13(A) to 13(C) are plan views illustrating ultrasonic propagation tubes and objects to be cleaned according to variations 11 to 13 of an embodiment 2, respectively.

FIGS. 13(A) to 13(C) are plan views illustrating ultrasonic propagation tubes and objects to be cleaned according to variations 11 to 13 of the embodiment 2. Ultrasonic propagation tubes 51 to 53 according to the variations 11 to 13 are applied to ultrasonic cleaning devices using the propagation liquid and the cleaning liquid in common.

As shown in FIGS. 13(A) to 13(C), by disposing outlets of the ultrasonic propagation tubes 51 to 53 for flowing the cleaning liquid as the propagation liquid above the objects to be cleaned 21, the cleaning liquid as the propagation liquid can be supplied onto the objects to be cleaned 21. Also, similarly to the embodiment 2, a cleaning liquid supply device from outside is not needed. Also, the ultrasonic propagation tube can be manufactured with its distal end bent in an arbitrary direction, and a discharging direction of the cleaning liquid can be determined according to the device.

FIG. 14(A) is a sectional view illustrating an ultrasonic propagation tube and a cleaning liquid supply mechanism according to a variation 14 of the embodiment 1, and FIG. 14(B) is a sectional view illustrating a state in which the ultrasonic propagation tube and the cleaning liquid supply mechanism shown in FIG. 14(A) are arranged above the object to be cleaned.

This is a double tube structure in which a cleaning liquid supply pipe 54 is disposed outside the ultrasonic propagation tube 12 similar to the embodiment 1 shown in FIG. 1. An introduction port 54a for introducing the cleaning liquid 19 is provided at an upper part of the cleaning liquid supply pipe 54, and a round hole 54b or a slit (groove) is provided at a lower part of the cleaning liquid supply pipe 54. The cleaning liquid 19 is introduced into the cleaning liquid supply pipe 54 from the introduction port 54a, and the cleaning liquid 19 in the cleaning liquid supply pipe 54 is discharged onto the object to be cleaned 21 through the round hole 54b or the slit. Since the round hole 54b or the slit is disposed in proximity of the object to be cleaned 21, a liquid film 19a formed from the cleaning liquid 19 in contact with the cleaning liquid supply pipe 54 is formed on the object to be cleaned 21, and the object is cleaned while the ultrasonic energy is supplied to the object to be cleaned 21 through the liquid film 19a.

FIG. 14(C) is a sectional view illustrating a state in which an ultrasonic propagation tube and a cleaning liquid supply mechanism according to a variation 15 of the embodiment 1 are arranged above the object to be cleaned, and the same reference numerals are given to the same portions as those in FIG. 14(B), and only different portions will be described.

As shown in FIG. 14(C), the round hole 54b or the slit of the cleaning liquid supply pipe 54 is disposed with a distance far away from the object to be cleaned 21. Even with this arrangement, the cleaning liquid 19 to which the ultrasonic energy propagated can be supplied to the object to be cleaned.

FIG. 15 is a sectional view illustrating an ultrasonic propagation tube according to a variation 16 of the embodiment 1. An ultrasonic propagation tube 55 has a double-tube structure constituted by an inner tube 55a and an outer tube 55b. A distal end (front end portion) 55a1 of the inner tube 55a is open, and a distal end (front end portion) 55b1 of the outer tube 55b is closed. On a side wall of the outer tube 55b, a discharge port 55b2 for discharging the propagation liquid is provided. As a result, the propagation liquid 15 discharged from the distal end 55a1 of the inner tube 55a can be recovered by the outer tube 55b, and the recovered propagation liquid 15 can be discharged from the discharge port 55b2 of the outer tube 55b. That is, the ultrasonic energy discharged together with the propagation liquid 15 from the distal end 55a1 of the inner tube 55a can be circulated on an inner face of the outer tube 55b, which is an irradiation region, and the ultrasonic energy can be effectively used. Also, the outlet of the propagation liquid 15 can be provided at an arbitrary location of the outer tube 55b and can be designed according to an installation space of the device.

In the ultrasonic cleaning device according to the variation 16, the ultrasonic propagation tube 12 of the ultrasonic cleaning device shown in FIG. 1 may be changed to the ultrasonic propagation tube 55 shown in FIG. 15 and put into practice. Also, in the ultrasonic cleaning device according to the variation 16, the ultrasonic propagation tube 12 of the ultrasonic cleaning device shown in FIG. 4 may be changed to the ultrasonic propagation tube 55 shown in FIG. 15 and put into practice. In this case, the joint 25 shown in FIG. 4 is mounted at the discharge port 55b shown in FIG. 15.

In the variation 16 also, the effect similar to that of the embodiment 2 can be obtained.

Immersion-Type Cleaning

Embodiment 3

Figure 16:
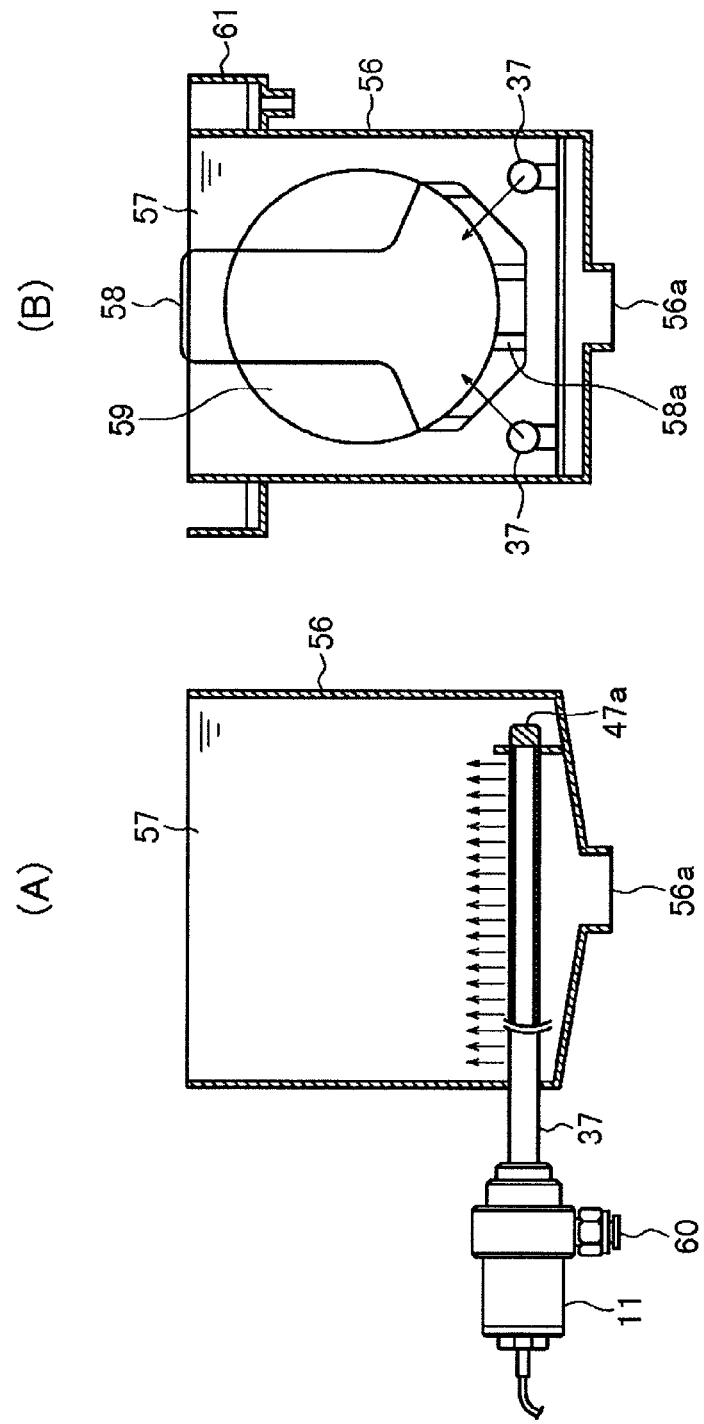
FIG. 16(A) is a sectional view illustrating an immersion-type ultrasonic cleaning device according to an embodiment 3 of the present invention.
FIG. 16(B) is a sectional view obtained by cutting the ultrasonic cleaning device in a direction perpendicular to the section shown in FIG. 16(A).

FIG. 16(A) is a sectional view illustrating an immersion-type ultrasonic cleaning device according to an embodiment 3 of the present invention, and FIG. 16(B) is a sectional view obtained by cutting the ultrasonic cleaning device in a direction perpendicular to the section shown in FIG. 16(A).

This ultrasonic cleaning device has a cleaning tank 56 filled with a cleaning liquid 57 and is a device in which the cleaning tank 56 is filled with the cleaning liquid 57 and a carrier (transporting unit) 58 holding a plurality of semiconductor wafers 59 as objects to be cleaned is immersed for cleaning in the cleaning liquid 57 in the cleaning tank 56.

In the cleaning tank 56, the two ultrasonic propagation tubes 37 shown in FIGS. 6(A) and 6(B) are inserted and mounted. The ultrasonic propagation tube 40 shown in FIGS. 7(A) and 7(B) may be used in this embodiment. At a distal end (front end portion) of the ultrasonic propagation tube 37, the attenuator 47a for absorbing ultrasonic energy similar to that in FIG. 11 is mounted, and the attenuator 47a exerts the effect similar to that of the variation 7 shown in FIG. 11.

At a base end (rear end portion) of the ultrasonic propagation tube 37, an ultrasonic transducer (not shown) is disposed in an opposing manner, and the ultrasonic transducer is disposed in the housing 11. In this housing 11, a cleaning liquid inlet 60 is provided.

The cleaning liquid also acting as a propagation liquid is provided with ultrasonic energy by the ultrasonic transducer, the cleaning liquid is discharged into the cleaning tank 56 through the round hole in the ultrasonic propagation tube 37 and overflowed from an upper part of the cleaning tank 56, and the overflowed cleaning liquid is recovered by a cleaning liquid recovery tank 61.

According to the embodiment 3, since the ultrasonic propagation tube 37 is disposed so that the ultrasonic energy can be supplied to the semiconductor wafer 59, avoiding a receiver portion 58a of the carrier 58, a portion shaded by the receiver portion or generation of air bubbles such as in a prior-art immersion-type ultrasonic cleaning device can be suppressed.

Also, since there is no need to provide an oscillation plate as in the prior-art immersion-type ultrasonic cleaning device, a drain port 56a can be provided on a bottom face of the cleaning tank 56, and time for discharge can be reduced and the cleaning liquid can be fully discharged. Also, without newly preparing a cleaning tank, by adding the ultrasonic propagation tube 37 to the cleaning tank of the prior-art immersion-type ultrasonic cleaning device, the ultrasonic cleaning device of this embodiment can be realized.

Figure 17:
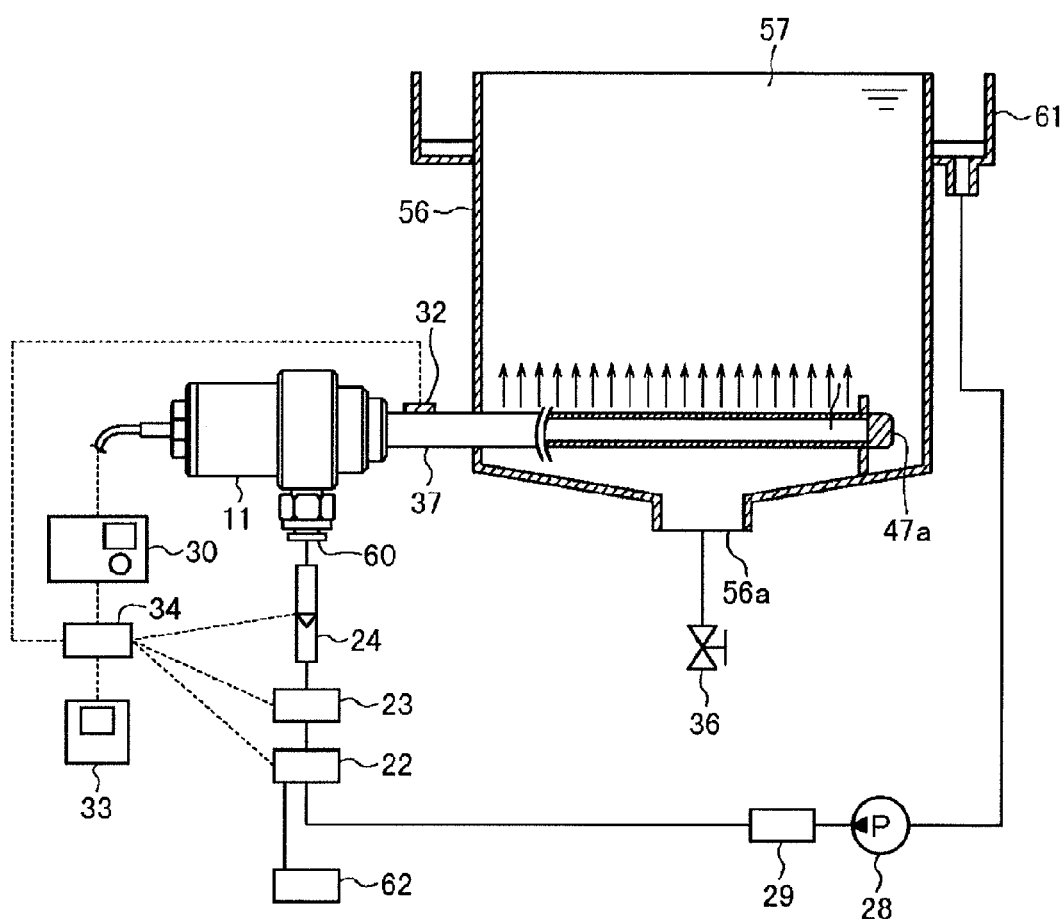
FIG. 17 is a configuration diagram illustrating a system of the ultrasonic cleaning device of the embodiment 3 of the present invention.

Next, an example in which the ultrasonic cleaning device shown in FIGS. 16(A) and 16(B) is systematized will be described referring to FIG. 17. FIG. 17 is a configuration diagram illustrating a system of the ultrasonic cleaning device of the embodiment 3, and the same reference numerals are given to the same portions to those in FIGS. 16(A) and 16(B).

As shown in FIG. 17, a cleaning liquid supply device 62 for supplying a cleaning liquid also acting as a propagation liquid is supplied to the ultrasonic propagation tube 37 through the dissolved gas concentration adjuster 22, the temperature adjuster 23, the flow meter 24, and the cleaning liquid inlet 60. Here, it is possible to set characteristics (dissolved gas concentration, temperature, flow rate) of the cleaning liquid to conditions suitable for the cleaning.

The cleaning liquid provided with ultrasonic energy is discharged from a hole provided on a side surface of the ultrasonic propagation tube 37, and the cleaning liquid is supplied together with the ultrasonic energy into the cleaning tank 56. The cleaning liquid 57 in the cleaning tank 56 is overflowed from the upper part of the cleaning tank 56, and the overflowed cleaning liquid is recovered by a cleaning liquid recovery tank 61. The recovered cleaning liquid is circulated by the circulation pump 28 and passed through a filter 29 for regeneration. The regenerated cleaning liquid is supplied to the ultrasonic propagation tube 37 through the dissolved gas concentration adjuster 22, the temperature adjuster 23, and the flow meter 24, which is the same path as that described above.

Electrical power is supplied to the ultrasonic transducer by the oscillator 30, an ultrasonic wave is provided to the cleaning liquid by the ultrasonic transducer, and ultrasonic energy propagates to the cleaning liquid filled in the ultrasonic propagation tube 37.

The sound pressure sensor 32 is mounted on a side surface of the ultrasonic propagation tube 37, and the ultrasonic energy transmitted through the ultrasonic propagation tube 37 is detected by this sound pressure sensor 32. Data of the detected ultrasonic energy is sent to the sound pressure meter 33 through the CPU 34, converted to a voltage value at the sound pressure meter 33 and sent to the CPU 34. An output voltage value of the oscillator 30 is also sent to the CPU 34 at the same time, and if the sound pressure value (voltage value of the ultrasonic energy) is lower than the output voltage value, it can be determined that the ultrasonic energy has been lowered. The characteristics of the cleaning liquid 57 (dissolved gas concentration, temperature, flow rate) are also sent as data to the CPU 34 from the dissolved gas concentration adjuster 22, the temperature adjuster 23, and the flow meter 24, respectively. The CPU 34 can control the oscillation to start after confirming that the data has reached a predetermined value. In addition, empty operation caused by a lowered flow rate can be prevented.

If the cleaning liquid 57 is to be replaced, the cleaning liquid in the cleaning tank 56 is discharged from the drain port 56a and drained to the drain 36.

Depending on the type of the cleaning liquid 57, the temperature is raised to approximately 70° C., and in that case, in order to maintain cleaning quality, the temperature is preferably kept constant. For this purpose, the temperature of the propagation liquid 57 can be kept at approximately 70° C. by the temperature adjuster 23. Temperature rise of the ultrasonic transducer during operation is approximately a liquid temperature +20° C. With the liquid temperature of 70° C., the temperature of the ultrasonic transducer becomes 90° C., but an allowable temperature of the ultrasonic transducer is approximately 120° C., and there is no problem in use.

(Variation)

Figure 18:
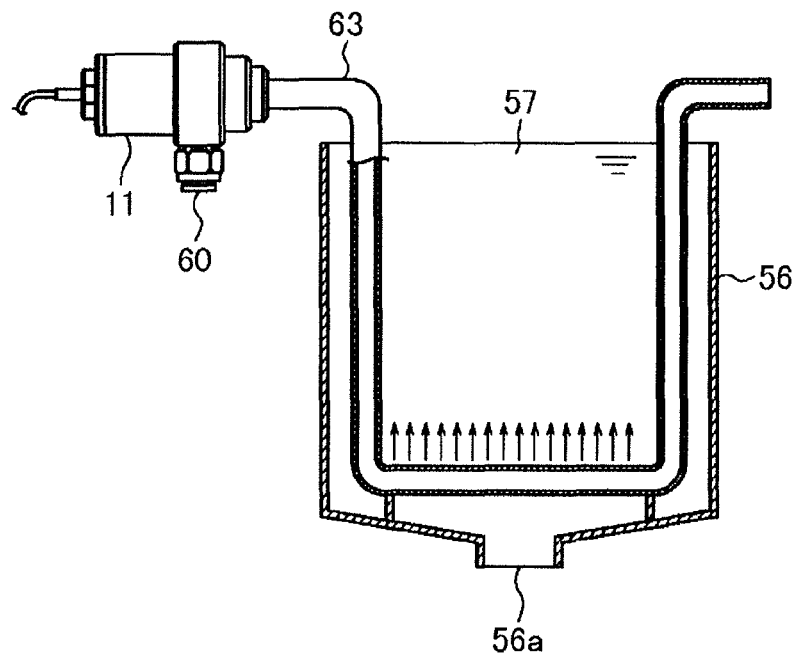
FIG. 18 is a sectional view illustrating an immersion-type ultrasonic cleaning device according to a variation 17 of the embodiment 3.

FIG. 18 is a sectional view illustrating an immersion-type ultrasonic cleaning device according to a variation 17 of the embodiment 3, and the same reference numerals are given to the same portions as those in FIG. 16(A), and only different portions will be described.

An ultrasonic propagation tube 63 is manufactured in a shape bent in the middle, and an inlet and an outlet for a cleaning liquid acting as a propagation liquid can be provided outside a cleaning tank. That is, in the ultrasonic cleaning device shown in FIGS. 16(A) and 16(B), a mounting hole of the ultrasonic propagation tube 37 is provided in a wall face of the cleaning tank 56, and the ultrasonic propagation tube 37 is inserted into the cleaning tank 56 through this mounting hole. On the other hand, in the variation 17, there is no need to provide a mounting hole for the ultrasonic propagation tube in the wall face of the cleaning tank 56. Therefore, with this variation, the ultrasonic propagation tube can be easily added to a cleaning tank without a mounting hole.

In the above variation 17 also, the effect similar to that of the embodiment 3 can be obtained.

Figure 19:
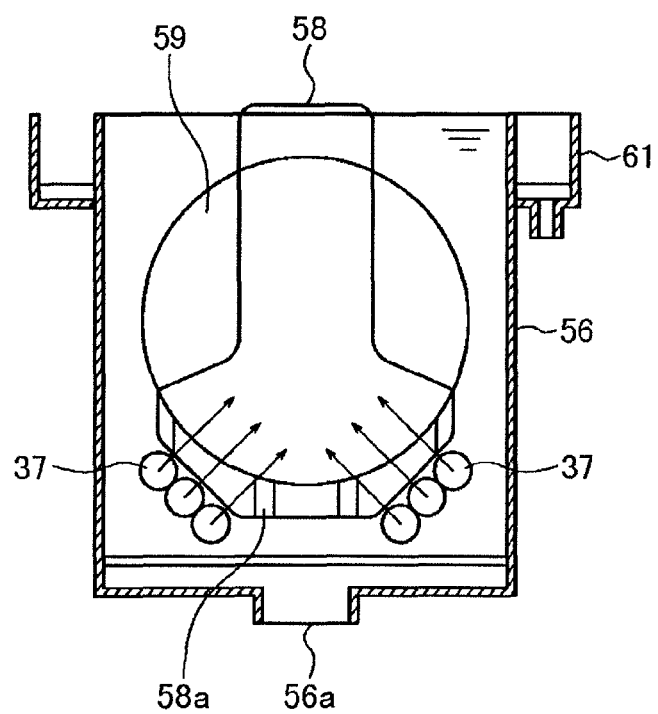
FIG. 19 is a sectional view illustrating an immersion-type ultrasonic cleaning device according to a variation 18 of the embodiment 3.

FIG. 19 is a sectional view illustrating an immersion-type ultrasonic cleaning device according to a variation 18 of the embodiment 3, and the same reference numerals are given to the same portions as those in FIG. 16(B), and only different portions will be described.

By arranging a large number of the ultrasonic propagation tubes 37 in the cleaning tank 56, a cleaning area can be widened. That is, in the ultrasonic cleaning device shown in FIGS. 16(A) and 16(B), the two ultrasonic propagation tubes 37 are disposed in the cleaning tank 56. In the variation 18, six ultrasonic propagation tubes 37 are disposed in the cleaning tank 56.

In the above variation 18 also, the effect similar to that of the embodiment 3 can be obtained.

Figure 20:
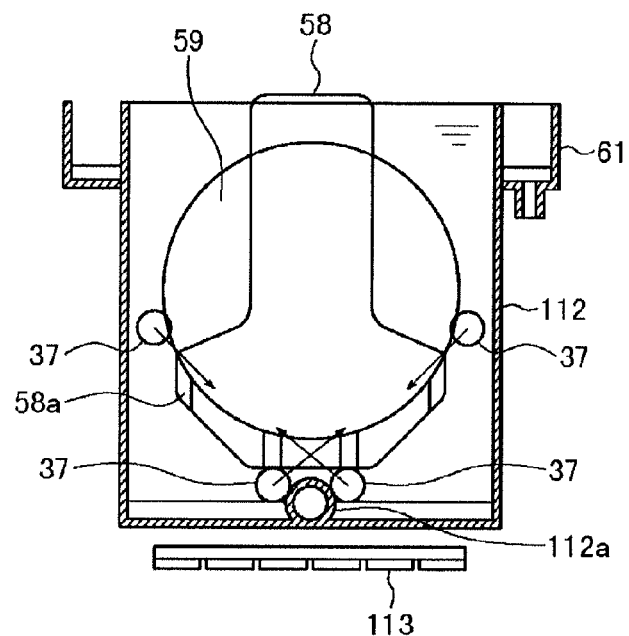
FIG. 20 is a sectional view illustrating an immersion-type ultrasonic cleaning device according to a variation 19 of the embodiment 3.

FIG. 20 is a sectional view illustrating an immersion-type ultrasonic cleaning device according to a variation 19 of the embodiment 3, and the same reference numerals are given to the same portions as those in FIG. 16(B), and only different portions will be described.

Figure 27:
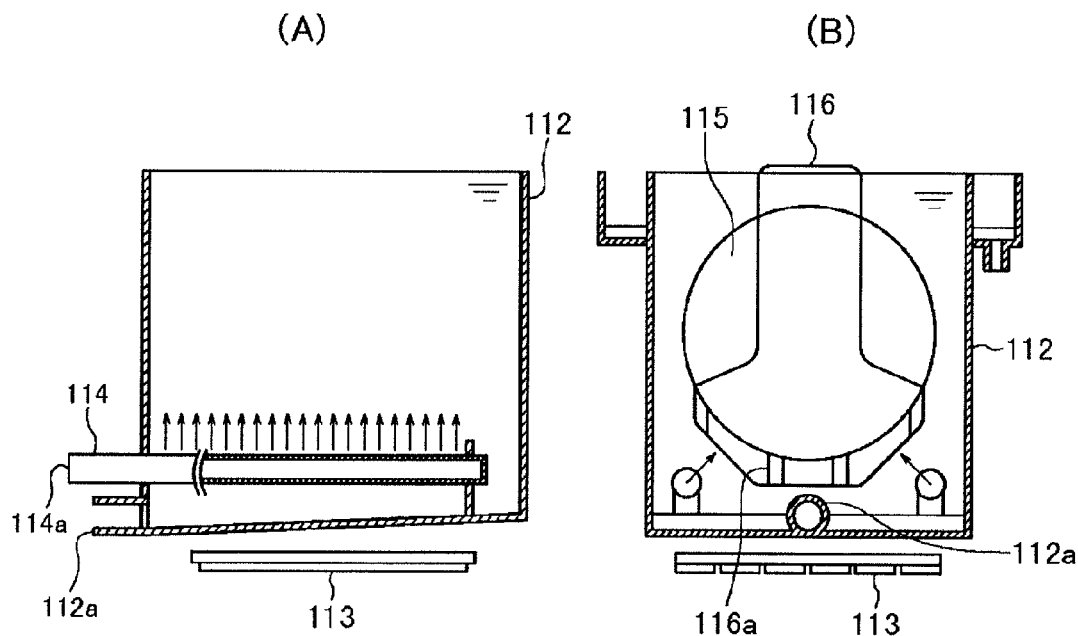
FIG. 27(A) is a sectional view illustrating a prior-art immersion type ultrasonic cleaning device.
FIG. 27(B) is a sectional view obtained by cutting the ultrasonic cleaning device in a direction perpendicular to the section shown in FIG. 27(A).

In the ultrasonic cleaning device of the variation 19, the ultrasonic propagation tube 37 is added to the prior-art immersion-type cleaning tank 112 shown in FIG. 27B and used with the oscillation plate 113. In this case, by arranging four ultrasonic propagation tubes 37 in the vicinity of the receiver 58a so that the cleaning liquid provided with the ultrasonic energy is discharged in the vicinity of the receiver 58a, there is an effect that air bubbles generated in the vicinity of the receiver 58a are removed.

Large Substrate Cleaning

Embodiment 4

Figure 21:
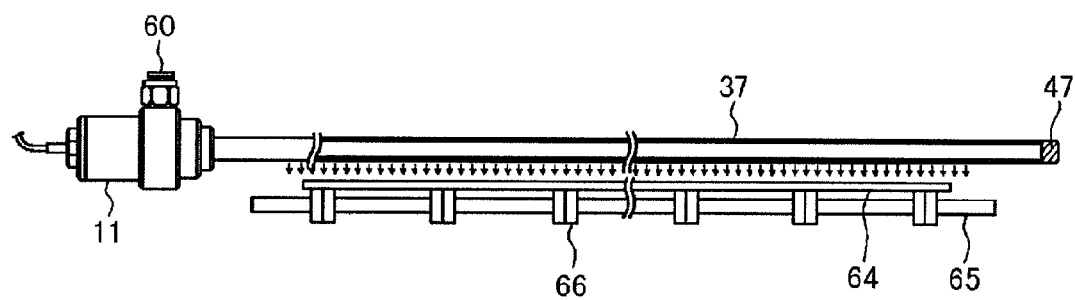
FIG. 21 is a sectional view illustrating an ultrasonic cleaning device for cleaning a large substrate according to an embodiment 4 of the present invention.

FIG. 21 is a sectional view illustrating an ultrasonic cleaning device for cleaning a large substrate according to an embodiment 4 of the present invention.

In the ultrasonic cleaning device shown in FIG. 21, the ultrasonic propagation tube 37 shown in FIGS. 6(A) and 6(B) are used. In this embodiment, the ultrasonic propagation tube 40 shown in FIGS. 7(A) and 7(B) may be also used. At the distal end (front end portion) of the ultrasonic propagation tube 37, the attenuator 47a for absorbing ultrasonic energy similar to that in FIG. 11 is mounted, and the attenuator 47a exerts the effect similar to that of the variation 7 shown in FIG. 11.

At a base end (rear end portion) of the ultrasonic propagation tube 37, an ultrasonic transducer (not shown) is disposed in an opposing manner, and the ultrasonic transducer is disposed in the housing 11. In this housing 11, the cleaning liquid inlet 60 is provided.

The cleaning liquid also acting as a propagation liquid is provided with ultrasonic energy by the ultrasonic transducer, and the cleaning liquid is discharged onto the surface of a large substrate 64, which is an object to be cleaned, through a round hole in the ultrasonic propagation tube 37.

The large substrate 64 is held by a holding mechanism so that a surface thereof opposes a side surface of the ultrasonic propagation tube 37. This holding mechanism has a plurality of transporting shafts 65 arranged with a predetermined interval, a plurality of transporting rollers 66 mounted on the transporting shaft 65, and a rotation mechanism (not shown) for rotating the transporting shafts 65.

By rotating the transporting roller 66 through rotation of the transporting shaft 65 using the rotation mechanism, the cleaning liquid provided with the ultrasonic energy is discharged from the plurality of round holes onto the surface (face to be cleaned) of the large substrate 64 as shown by an arrow while the large substrate 64 is moved relatively to the ultrasonic propagation tube 37. In this way, the surface of the large substrate 64 can be cleaned.

If the above ultrasonic cleaning device is applied to the large substrate 64 having a size of 1.5 m×1.5 m, a flow rate of the cleaning liquid discharged from the ultrasonic propagation tube 37 can be reduced to approximately 20 L/min, which is ⅕ of that of the prior-art ultrasonic cleaning device, and the weight of the ultrasonic transducer can be reduced to approximately 6 kg, which is ⅓ of that of the prior-art ultrasonic cleaning device. Therefore, manufacture and installation of the ultrasonic cleaning device becomes extremely easier as compared with the prior-art device.

(Variation)

Figure 22:
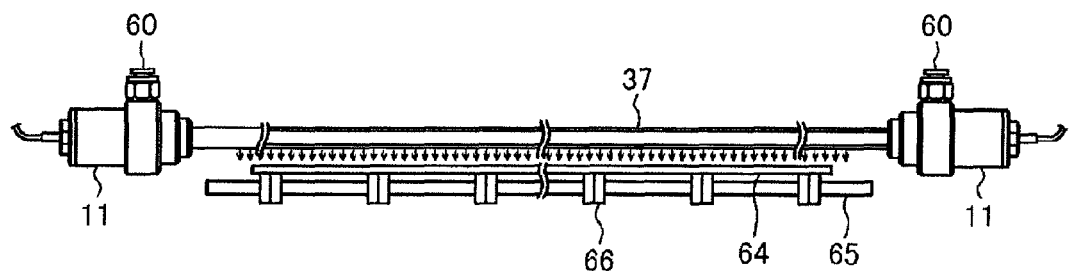
FIG. 22 is a sectional view illustrating an ultrasonic cleaning device according to a variation 20 of the embodiment 4.

FIG. 22 is a sectional view illustrating an ultrasonic propagation device according to a variation 20 of the embodiment 4, and the same reference numerals are given to the same portions as those in FIG. 21, and only different portions will be described.

Ultrasonic transducers (not shown) are mounted at both ends of the ultrasonic propagation tube 37. As a result, ultrasonic energy provided to the cleaning liquid can be increased.

In the above variation 20 also, the effect similar to that of the embodiment 4 can be obtained.

Figure 23:
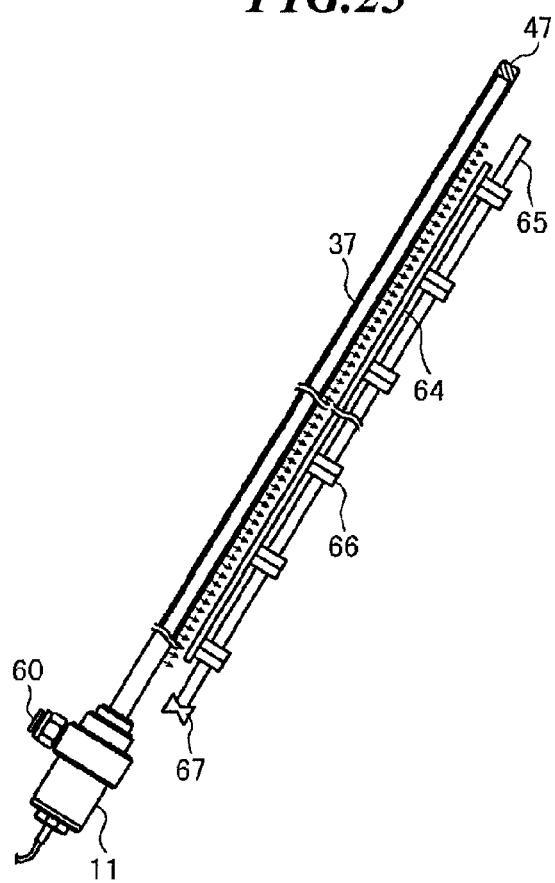
FIG. 23 is a sectional view illustrating an ultrasonic cleaning device according to a variation 21 of the embodiment 4.

FIG. 23 is a sectional view illustrating an ultrasonic propagation device according to a variation 21 of the embodiment 4, and the same reference numerals are given to the same portions as those in FIG. 21, and only different portions will be described.

If the large substrate 64 with a size of 1.5 m×1.5 m or more is horizontally placed as in the embodiment 4, for example, there is a fear that the large substrate is deflected by the weight of the discharged cleaning liquid, and the liquid cannot be completely drained or dried.

Then, since the ultrasonic propagation tube 37 is light-weighted and can be easily installed even if it is a vertical type, vertical transporting of the large substrate 64 is used. That is, the large substrate 64 is inclined and held by the holding mechanism for transporting. As a result, the cleaning liquid on the large substrate 64 can be easily drained after cleaning and can be easily dried.

In the above variation 21 also, the effect similar to that of the embodiment 4 can be obtained.

The present invention is not limited to the above embodiments and variations but is capable of being put into practice with various changes within a scope not departing from the gist of the present invention. For example, it is possible to put the present invention into practice by combining the embodiments and variations as appropriate.

The invention claimed is:

1. An ultrasonic cleaning device comprising:
   an ultrasonic transducer for providing ultrasonic energy to a propagation liquid;
   an ultrasonic propagation tube for flowing the propagation liquid provided with the ultrasonic energy by said ultrasonic transducer;
   a cleaning liquid supply pipe disposed outside said ultrasonic propagation tube so as to cover said ultrasonic propagation tube;
   a holding mechanism disposed below said cleaning liquid supply pipe for holding an object to be cleaned;
   an introduction port provided in said cleaning liquid supply pipe for introducing a cleaning liquid; and
   a slit or a plurality of holes provided on a side wall of said cleaning liquid supply pipe for discharging the cleaning liquid introduced from said introduction port to a cleaning surface of the object to be cleaned held by said holding mechanism.

2. The ultrasonic cleaning device according to claim 1, wherein
   said cleaning liquid supply pipe is disposed so that a side surface thereof may contact a liquid film of the cleaning liquid formed on said cleaning surface by discharging the cleaning liquid from said slit or said plurality of holes to said cleaning surface.

\* \* \* \* \*